(12) United States Patent
Fox et al.

(10) Patent No.: US 9,357,036 B2
(45) Date of Patent: May 31, 2016

(54) METHODS AND SYSTEMS FOR CHIP-TO-CHIP COMMUNICATION WITH REDUCED SIMULTANEOUS SWITCHING NOISE

(71) Applicant: Kandou Labs, S.A., Lausanne (CH)

(72) Inventors: John Fox, Kislingbury (GB); Brian Holden, Monte Sereno, CA (US); Peter Hunt, Northampton (GB); John D. Keay, Bedford (GB); Amin Shokrollahi, Preverenges (CH); Richard Simpson, Bedford (GB); Anant Singh, Pully (CH); Andrew Kevin John Stewart, Astcote (GB); Giuseppe Surace, Northampton (GB)

(73) Assignee: KANDOU LABS, S.A. (CH)

( * ) Notice: Subject to any disclaimer, the term of this patent is extended or adjusted under 35 U.S.C. 154(b) by 0 days.

(21) Appl. No.: 14/842,511

(22) Filed: Sep. 1, 2015

(65) Prior Publication Data

US 2015/0381768 A1    Dec. 31, 2015

Related U.S. Application Data

(63) Continuation of application No. 14/158,452, filed on Jan. 17, 2014, now Pat. No. 9,124,557.

(60) Provisional application No. 61/753,870, filed on Jan. 17, 2013.

(51) Int. Cl.
*H04L 29/02* (2006.01)
*H04L 25/02* (2006.01)
(Continued)

(52) U.S. Cl.
CPC .................. *H04L 69/04* (2013.01); *H03M 5/16* (2013.01); *H04L 25/0272* (2013.01); *H04L 25/4917* (2013.01); *H03M 5/20* (2013.01); *Y02B 60/1228* (2013.01); *Y02B 60/1235* (2013.01)

(58) Field of Classification Search
CPC .......... H04L 25/0272; H04L 25/4917–25/493; H03M 5/16–5/20
See application file for complete search history.

(56) References Cited

U.S. PATENT DOCUMENTS

| | | | |
|---|---|---|---|
| 3,196,351 | A | 7/1965 | Slepian |
| 3,636,463 | A | 1/1972 | Ongkiehong |

(Continued)

FOREIGN PATENT DOCUMENTS

| | | |
|---|---|---|
| CN | 101478286 | 7/2009 |
| EP | 2039221 B1 | 3/2009 |

(Continued)

OTHER PUBLICATIONS

International Search Report and Written Opinion of the International Searching Authority, mailed Nov. 5, 2012, in International Patent Application S.N. PCT/EP2012/052767, 7 pages.

(Continued)

*Primary Examiner* — Howard Williams
(74) *Attorney, Agent, or Firm* — Invention Mine LLC

(57) ABSTRACT

Systems and methods are described for transmitting data over physical channels to provide a high speed, low latency interface such as between a memory controller and memory devices with significantly reduced or eliminated Simultaneous Switching Output noise. Controller-side and memory-side embodiments of such channel interfaces are disclosed which do not require additional pin count or data transfer cycles, have low power utilization, and introduce minimal additional latency. In some embodiments of the invention, three or more voltage levels are used for signaling.

20 Claims, 14 Drawing Sheets

(51) Int. Cl.
*H04L 25/49* (2006.01)
*H03M 5/16* (2006.01)
*H03M 5/20* (2006.01)
*H04L 29/06* (2006.01)

(56) References Cited

U.S. PATENT DOCUMENTS

| | | | |
|---|---|---|---|
| 3,939,468 A | 2/1976 | Mastin | |
| 4,163,258 A | 7/1979 | Ebihara et al. | |
| 4,181,967 A | 1/1980 | Nash et al. | |
| 4,206,316 A | 6/1980 | Burnsweig et al. | |
| 4,276,543 A | 6/1981 | Miller | |
| 4,486,739 A | 12/1984 | Franaszeck et al. | |
| 4,499,550 A | 2/1985 | Ray et al. | |
| 4,774,498 A | 9/1988 | Traa | |
| 4,864,303 A | 9/1989 | Ofek | |
| 4,897,657 A | 1/1990 | Brubaker | |
| 5,053,974 A | 10/1991 | Penz | |
| 5,166,956 A | 11/1992 | Baltus et al. | |
| 5,168,509 A | 12/1992 | Nakamura et al. | |
| 5,283,761 A | 2/1994 | Gillingham | |
| 5,287,305 A * | 2/1994 | Yoshida | G11C 11/56 365/168 |
| 5,412,689 A | 5/1995 | Chan et al. | |
| 5,459,465 A | 10/1995 | Kagey | |
| 5,511,119 A | 4/1996 | Lechleider | |
| 5,553,097 A | 9/1996 | Dagher | |
| 5,599,550 A | 2/1997 | Kohlruss et al. | |
| 5,659,353 A | 8/1997 | Kostreski et al. | |
| 5,825,808 A | 10/1998 | Hershey et al. | |
| 5,875,202 A | 2/1999 | Venters | |
| 5,945,935 A | 8/1999 | Kusumoto | |
| 5,995,016 A | 11/1999 | Perino | |
| 6,005,895 A | 12/1999 | Perino et al. | |
| 6,084,883 A | 7/2000 | Norrell et al. | |
| 6,172,634 B1 | 1/2001 | Leonowich et al. | |
| 6,175,230 B1 | 1/2001 | Hamblin et al. | |
| 6,232,908 B1 | 5/2001 | Nakaigawa | |
| 6,278,740 B1 | 8/2001 | Nordyke | |
| 6,346,907 B1 | 2/2002 | Dacy | |
| 6,359,931 B1 | 3/2002 | Perino et al. | |
| 6,404,820 B1 | 6/2002 | Postol | |
| 6,404,920 B1 | 6/2002 | Hsu | |
| 6,417,737 B1 | 7/2002 | Moloudi et al. | |
| 6,452,420 B1 | 9/2002 | Wong | |
| 6,483,828 B1 | 11/2002 | Balachandran | |
| 6,504,875 B2 | 1/2003 | Perino et al. | |
| 6,509,773 B2 | 1/2003 | Buchwald | |
| 6,556,628 B1 | 4/2003 | Poulton et al. | |
| 6,563,382 B1 | 5/2003 | Yang et al. | |
| 6,621,427 B2 | 9/2003 | Greenstreet | |
| 6,650,638 B1 | 11/2003 | Walker et al. | |
| 6,661,355 B2 | 12/2003 | Cornelius et al. | |
| 6,766,342 B2 | 7/2004 | Kechriotis | |
| 6,839,429 B1 | 1/2005 | Gaikwald et al. | |
| 6,954,492 B1 | 10/2005 | Williams | |
| 6,990,138 B2 | 1/2006 | Bejjani | |
| 6,999,516 B1 | 2/2006 | Rajan | |
| 7,023,817 B2 | 4/2006 | Kuffner | |
| 7,053,802 B2 | 5/2006 | Cornelius | |
| 7,085,153 B2 | 8/2006 | Ferrant et al. | |
| 7,142,612 B2 | 11/2006 | Horowitz et al. | |
| 7,142,865 B2 | 11/2006 | Tsai | |
| 7,167,019 B2 | 1/2007 | Broyde et al. | |
| 7,180,949 B2 | 2/2007 | Kleveland et al. | |
| 7,184,483 B2 | 2/2007 | Rajan | |
| 7,356,213 B1 | 4/2008 | Cunningham et al. | |
| 7,358,869 B1 | 4/2008 | Chiarulli et al. | |
| 7,362,130 B2 | 4/2008 | Broyde et al. | |
| 7,389,333 B2 | 6/2008 | Moore et al. | |
| 7,633,850 B2 | 12/2009 | Ahn | |
| 7,656,321 B2 | 2/2010 | Wang | |
| 7,706,524 B2 | 4/2010 | Zerbe | |
| 7,746,764 B2 | 6/2010 | Rawlins et al. | |
| 7,787,572 B2 | 8/2010 | Scharf et al. | |
| 7,882,413 B2 | 2/2011 | Chen et al. | |
| 7,933,770 B2 | 4/2011 | Kruger et al. | |
| 8,064,535 B2 | 11/2011 | Wiley | |
| 8,091,006 B2 | 1/2012 | Prasad et al. | |
| 8,106,806 B2 | 1/2012 | Toyomura | |
| 8,159,375 B2 | 4/2012 | Abbasafar | |
| 8,159,376 B2 | 4/2012 | Abbasfar | |
| 8,199,849 B2 * | 6/2012 | Oh | H04L 25/4923 326/21 |
| 8,279,094 B2 | 10/2012 | Abbasfar | |
| 8,295,250 B2 | 10/2012 | Gorokhov | |
| 8,310,389 B1 | 11/2012 | Chui | |
| 8,429,495 B2 | 4/2013 | Przybylski | |
| 8,442,099 B1 | 5/2013 | Sederat | |
| 8,442,210 B2 | 5/2013 | Zerbe | |
| 8,443,223 B2 | 5/2013 | Abbasfar | |
| 8,462,891 B2 | 6/2013 | Kizer et al. | |
| 8,520,493 B2 | 8/2013 | Goulahsen | |
| 8,547,272 B2 | 10/2013 | Nestler et al. | |
| 8,578,246 B2 | 11/2013 | Mittelholzer | |
| 8,588,280 B2 | 11/2013 | Oh et al. | |
| 8,593,305 B1 | 11/2013 | Tajalli et al. | |
| 8,649,460 B2 | 2/2014 | Ware et al. | |
| 8,649,556 B2 | 2/2014 | Wedge | |
| 8,718,184 B1 | 5/2014 | Cronie | |
| 8,782,578 B2 | 7/2014 | Tell | |
| 8,989,317 B1 | 3/2015 | Holden | |
| 9,077,386 B1 | 7/2015 | Holden | |
| 2001/0055344 A1 | 12/2001 | Lee et al. | |
| 2002/0034191 A1 | 3/2002 | Shattil | |
| 2002/0057592 A1 | 5/2002 | Robb | |
| 2002/0163881 A1 | 11/2002 | Dhong | |
| 2002/0174373 A1 | 11/2002 | Chang | |
| 2003/0071745 A1 | 4/2003 | Greenstreet | |
| 2003/0105908 A1 | 6/2003 | Perino et al. | |
| 2003/0146783 A1 | 8/2003 | Bandy et al. | |
| 2003/0227841 A1 | 12/2003 | Tateishi et al. | |
| 2004/0003336 A1 | 1/2004 | Cypher | |
| 2004/0003337 A1 | 1/2004 | Cypher | |
| 2004/0057525 A1 | 3/2004 | Rajan et al. | |
| 2004/0086059 A1 | 5/2004 | Eroz et al. | |
| 2004/0156432 A1 | 8/2004 | Hidaka | |
| 2005/0057379 A1 | 3/2005 | Jansson | |
| 2005/0135182 A1 | 6/2005 | Perino et al. | |
| 2005/0152385 A1 | 7/2005 | Cioffi | |
| 2005/0174841 A1 | 8/2005 | Ho | |
| 2005/0286643 A1 | 12/2005 | Ozawa et al. | |
| 2006/0115027 A1 | 6/2006 | Srebranig | |
| 2006/0159005 A1 | 7/2006 | Rawlins et al. | |
| 2007/0188367 A1 | 8/2007 | Yamada | |
| 2007/0260965 A1 | 11/2007 | Schmidt et al. | |
| 2007/0263711 A1 | 11/2007 | Kramer et al. | |
| 2007/0283210 A1 | 12/2007 | Prasad et al. | |
| 2008/0104374 A1 | 5/2008 | Mohamed | |
| 2008/0159448 A1 | 7/2008 | Anim-Appiah et al. | |
| 2008/0169846 A1 | 7/2008 | Lan et al. | |
| 2008/0273623 A1 | 11/2008 | Chung et al. | |
| 2008/0284524 A1 | 11/2008 | Kushiyama | |
| 2009/0059782 A1 | 3/2009 | Cole | |
| 2009/0092196 A1 | 4/2009 | Okunev | |
| 2009/0132758 A1 | 5/2009 | Jiang | |
| 2009/0154500 A1 | 6/2009 | Diab et al. | |
| 2009/0185636 A1 | 7/2009 | Palotai et al. | |
| 2009/0212861 A1 | 8/2009 | Lim et al. | |
| 2009/0228767 A1 | 9/2009 | Oh et al. | |
| 2009/0257542 A1 | 10/2009 | Evans et al. | |
| 2010/0104047 A1 | 4/2010 | Chen et al. | |
| 2010/0180143 A1 | 7/2010 | Ware et al. | |
| 2010/0205506 A1 | 8/2010 | Hara | |
| 2010/0296550 A1 | 11/2010 | Abou Rjeily | |
| 2011/0051854 A1 | 3/2011 | Kizer et al. | |
| 2011/0084737 A1 | 4/2011 | Oh et al. | |
| 2011/0127990 A1 | 6/2011 | Wilson et al. | |
| 2011/0235501 A1 | 9/2011 | Goulahsen | |
| 2011/0268225 A1 | 11/2011 | Cronie et al. | |
| 2011/0299555 A1 | 12/2011 | Cronie et al. | |
| 2011/0302478 A1 | 12/2011 | Cronie et al. | |
| 2011/0317559 A1 | 12/2011 | Kern et al. | |
| 2012/0063291 A1 | 3/2012 | Hsueh | |

(56) References Cited

U.S. PATENT DOCUMENTS

| | | | |
|---|---|---|---|
| 2012/0161945 | A1 | 6/2012 | Single |
| 2012/0213299 | A1 | 8/2012 | Cronie et al. |
| 2013/0010892 | A1 | 1/2013 | Cronie et al. |
| 2013/0051162 | A1 | 2/2013 | Amirkhany et al. |
| 2014/0254730 | A1 | 9/2014 | Kim et al. |
| 2015/0010044 | A1 | 1/2015 | Zhang |
| 2015/0078479 | A1 | 3/2015 | Whitby-Strevens |

FOREIGN PATENT DOCUMENTS

| | | |
|---|---|---|
| JP | 2003163612 | 6/2003 |
| WO | 2009084121 | 7/2009 |
| WO | 2010031824 | 3/2010 |
| WO | 2011119359 | 9/2011 |

OTHER PUBLICATIONS

International Search Report and Written Opinion of the International Searching Authority, mailed Jul. 14, 2011 in International Patent Application S.N. PCT/EP2011/002170, 10 pages.
Healey, A., et al., "A Comparison of 25 Gbps NRZ & PAM-4 Modulation used in Legacy & Premium Backplane Channels", DesignCon 2012, 16 pages.
International Search Report for PCT/US2014/053563, dated Nov. 11, 2014, 2 pages.
Clayton, P., "Introduction to Electromagnetic Compatibility", Wiley-Interscience, 2006.
She et al., "A Framework of Cross-Layer Superposition Coded Multicast for Robust IPTV Services over WiMAX," IEEE Communications Society subject matter experts for publication in the WCNC 2008 proceedings, Mar. 31, 2008-Apr. 3, 2008, pp. 3139-3144.
Poulton, et al., "Multiwire Differential Signaling", UNC-CH Department of Computer Science Version 1.1, Aug. 6, 2003.
Skliar et al., A Method for the Analysis of Signals: the Square-Wave Method, Mar. 2008, Revista de Matematica: Teoria y Aplicationes, pp. 09-129.
International Search Report and Written Opinion from PCT/US2014/034220 mailed Aug. 21, 2014.
International Search Report and Written Opinion for PCT/US14/052986 mailed Nov. 24, 2014.
Burr, "Spherical Codes for M-ARY Code Shift Keying", University of York, Apr. 2, 1989, pp. 67-72, United Kingdom.
Slepian, D., "Premutation Modulation", IEEE, vol. 52, No. 3, Mar. 1965, pp. 228-236.
Stan, M., et al., "Bus-Invert Coding Low-Power I/O, IEEE Transactions on Very Large Scale Integration (VLSI) Systems", vol. 3, No. 1, Mar. 1995, pp. 49-58.
Tallani, L., et al., "Transmission Time Analysis for the Parallel Asynchronous Communication Scheme", IEEE Tranactions on Computers, vol. 52, No. 5, May 2003, pp. 558-571.
International Search Report and Written Opinion for PCT/EP2012/052767 mailed May 11, 2012.
International Search Report and Written Opinion for PCT/EP2011/059279 mailed Sep. 22, 2011.
International Search Report and Written Opinion for PCT/EP2011/074219 mailed Jul. 4, 2012.
Notification of Transmittal of the International Search Report and The Written Opinion of the International Searching Authority, or The Declaration for PCT/EP2013/002681, dated Feb. 25, 2014, 15 pages.
Ericson, T., et al., "Spherical Codes Generated by Binary Partitions of Symmetric Pointsets", IEEE Transactions on Information Theory, vol. 41, No. 1, Jan. 1995, pp. 107-129.
Farzan, K., et al., "Coding Schemes for Chip-to-Chip Interconnect Applications", IEEE Transactions on Very Large Scale Integration (VLSI) Systems, vol. 14, No. 4, Apr. 2006, pp. 393-406.
Abbasfar, A., "Generalized Differential Vector Signaling", IEEE International Conference on Communications, ICC '09, (Jun. 14, 2009), pp. 1-5.
Dasilva et al., "Multicarrier Orthogonal CDMA Signals for Quasi-Synchronous Communication Systems", IEEE Journal on Selected Areas in Communications, vol. 12, No. 5 (Jun. 1, 1994), pp. 842-852.
Wang et al., "Applying CDMA Technique to Network-on-Chip", IEEE Transactions on Very Large Scale Integration (VLSI) Systems, vol. 15, No. 10 (Oct. 1, 2007), pp. 1091-1100.
Cheng, W., "Memory Bus Encoding for Low Power: A Tutorial", Quality Electronic Design, IEEE, International Symposium on Mar. 26-28, 2001, pp. 199-204, Piscataway, NJ.
Brown, L., et al., "V.92: The Last Dial-Up Modem?", IEEE Transactions on Communications, IEEE Service Center, Piscataway, NJ., USA, vol. 52, No. 1, Jan. 1, 2004, pp. 54-61. XP011106836, ISSN: 0090-6779, DOI: 10.1109/tcomm.2003.822168, pp. 55-59.
Notification of Transmittal of International Search Report and The Written Opinion of the International Searching Authority, for PCT/US2015/018363, mailed Jun. 18, 2015, 13 pages.
Counts, L, et al., "One-Chip Slide Rule Works with Logs, Antilogs for Real-Time Processing," Analog Devices Computational Products 6, Reprinted from Electronic Design, May 2, 1985, 7 pages.
Design Brief 208 Using the Anadigm Multiplier CAM, Copyright 2002 Anadigm, 6 pages.
Grahame, J., "Vintage Analog Computer Kits," posted on Aug. 25, 2006 in Classic Computing, 2 pages, http.//www.retrothing.com/2006/08/classic_analog_html.
Schneider, J., et al., "ELEC301 Project: Building an Analog Computer," Dec. 19, 1999, 8 pages, http://www.clear.rice.edu/elec301/Projects99/anlgcomp/.
Tierney, J., et al., "A digital frequency synthesizer," Audio and Electroacoustics, IEEE Transactions, Mar. 1971, pp. 48-57, vol. 19, Issue 1, 1 page Abstract from http://ieeexplore.
"Introduction to: Analog Computers and the DSPACE System," Course Material ECE 5230 Spring 2008, Utah State University, www.coursehero.com, 12 pages.
Notification of Transmittal of the International Search Report and The Written Opinion of the International Searching Authority, or the Declaration, for PCT/US2014/015840, dated May 20, 2014. 11 pages.
Notification of Transmittal of The International Search Report and The Written Opinion of the International Searching Authority, or the Declaration, for PCT/US2014/043965, dated Oct. 22, 2014, 10 pages.
Notification of Transmittal of The International Search Report and The Written Opinion of the International Searching Authority, or The Declaration, dated Mar. 3, 2015, for PCT/US2014/066893, 9 pages.
International Preliminary Report on Patentability for PCT/US2014/015840, dated Aug. 11, 2015, 7 pages.
Jiang, A., et al., "Rank Modulation for Flash Memories", IEEE Transactions of Information Theory, Jun. 2006, vol. 55, No. 6, pp. 2659-2673.
Zouhair Ben-Neticha et al, "The streTched-Golay and other codes for high-SNR finite-delay quantization of the Gaussian source at ½ Bit per sample", IEEE Transactions on Communications, vol. 38, No. 12 Dec. 1, 1990, pp. 2089-2093, XP000203339, ISSN: 0090-6678, DOI: 10.1109/26.64647.

* cited by examiner

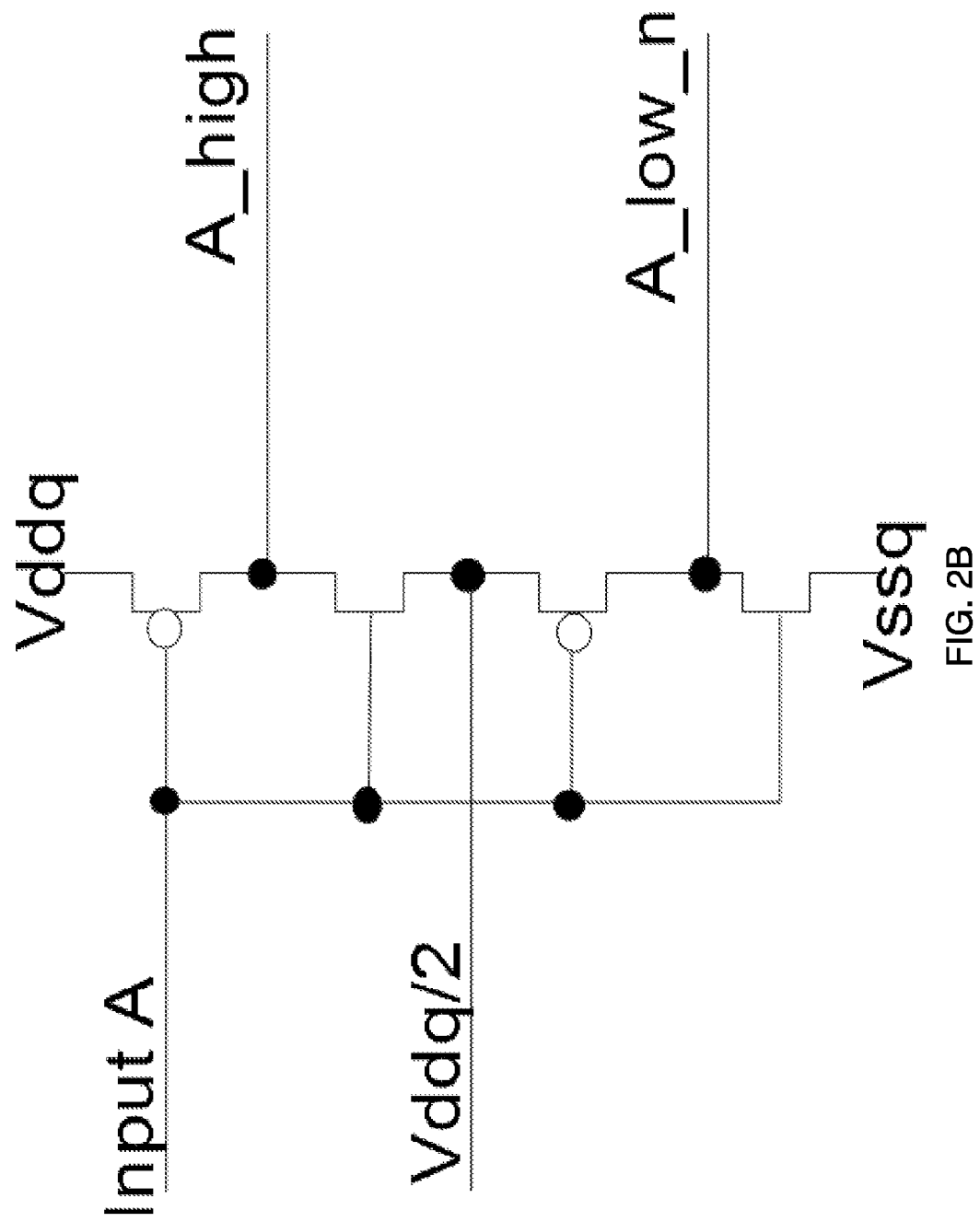

| Code | Interface size in number of wires | Worst case power on 128 wires | Average power consumption on 128 wires | Standard deviation of power consumption | Worst case SSO on 128 wires | Required SNR in dB | Number of comparators | Type of comparators |
|---|---|---|---|---|---|---|---|---|
| SE | 4 | 128 | 32 | 27.71 | 128 | 24 | 128 | Simple, referenced |
| P4P | 4 | 53.33 | 20 | 16.81 | 42.67 | 30.6 | 128 | 64 MIC, 64 simple, 96 x un- and 32 referenced |
| H4P | 4 | 48 | 17.5 | 12.87 | 32 | 30.2 | 128 | All MIC, 96 x un- and 32 referenced |
| 4b4wT-v1 | 4 | 32 | 23.25 | 10.93 | 0 | 29.7 | 192 | All MIC, unreferenced |
| 4b4wT-v2 | 4 | 32 | 23.25 | 10.93 | 0 | 28.6 | 256 | All MIC, unreferenced |
| 4b4wQ | 4 | 42.67 | 20 | 12.79 | 0 | 30.5 | 192 | All Simple, unreferenced |
| TL3-FS | 4 | 42.67 | 13.1 | | 42.67 | | 256 | Simple, referenced |
| TL3-RS | 4 | 42.67 | 6.5 | | 21.33 | | 267 | Simple, referenced |

FIG. 8A

| Name | Interface size | Peak SSO as fraction of full-swing CMOS | Average power as fraction of full-swing CMOS | Tx/Rx | Swing |
|---|---|---|---|---|---|
| TL3-FS | 3 | 33.33% | 41% | SE-Ternary | Full |
| TL3-RS | 3 | 16.67% | 20.5% | SE-Ternary | Half |
| TL4s-RS | 4 | 18.75% | 20% | SE-Ternary | Half |
| TL4e-RS | 4 | 12.5% | 20% | SE-Ternary | Half |
| TL5s-RS | 5 | 15% | 19% | SE-Ternary | Half |
| TL8s-RS | 8 | 12.5% | 20% | SE-Ternary | Half |

FIG. 8B

METHODS AND SYSTEMS FOR CHIP-TO-CHIP COMMUNICATION WITH REDUCED SIMULTANEOUS SWITCHING NOISE

CROSS REFERENCE TO RELATED APPLICATIONS

This application is a continuation of U.S. application Ser. No. 14/158,452, filed Jan. 17, 2014, naming John Fox, entitled "Methods and Systems for Chip-to-Chip Communication with Reduced Simultaneous Switching Noise, which is a non-provisional application claiming priority to U.S. provisional application No. 61/753,870 filed on Jan. 17, 2013, all of which are hereby incorporated herein by reference in their entirety for all purposes.

The following references are herein incorporated by reference in their entirety for all purposes:

U.S. Patent Publication 2011/0268225 of U.S. patent application Ser. No. 12/784,414, filed May 20, 2010, naming Harm Cronie and Amin Shokrollahi, entitled "Orthogonal Differential Vector Signaling" (hereinafter "Cronie I");

U.S. Patent Publication 2011/0302478 of U.S. patent application Ser. No. 12/982,777, filed Dec. 30, 2010, naming Harm Cronie and Amin Shokrollahi, entitled "Power and Pin Efficient Chip-to-Chip Communications with Common-Mode Resilience and SSO Resilience" (hereinafter "Cronie II");

U.S. patent application Ser. No. 13/030,027, filed Feb. 17, 2011, naming Harm Cronie, Amin Shokrollahi and Armin Tajalli, entitled "Methods and Systems for Noise Resilient, Pin-Efficient and Low Power Communications with Sparse Signaling Codes" (hereinafter "Cronie III"); and U.S. patent application Ser. No. 13/463,742, filed May 3, 2012, naming Harm Cronie and Amin Shokrollahi, entitled "Finite State Encoders and Decoders for Vector Signaling Codes" (hereafter called "Cronie IV").

U.S. patent application Ser. No. 13/603,107, filed Sep. 9, 2012, naming Brian Holden and Amin Shokrollahi, entitled "Methods and Systems for Selection of Unions of Vector Signaling Codes for Power and Pin Efficient Chip-To-Chip Communication" (hereinafter called "Holden I").

U.S. patent application Ser. No. 13/671,426, filed Nov. 7, 2012, naming Brian Holden and Amin Shokrollahi, entitled "Crossbar Switch Decoder for Vector Signaling Codes" (hereinafter called "Holden II").

BACKGROUND

In communication systems, information may be transmitted from one physical location to another. Furthermore, it is typically desirable that the transport of this information is reliable, is fast and consumes a minimal amount of resources.

Vector signaling is a method of signaling. With vector signaling, pluralities of signals on a plurality of wires are considered collectively although each of the plurality of signals may be independent. Each of the collective signals is referred to as a component and the number of plurality of wires is referred to as the "dimension" of the vector. In some embodiments, the signal on one wire is entirely dependent on the signal on another wire, as is the case with differential signaling pairs, so in some cases the dimension of the vector may refer to the number of degrees of freedom of signals on the plurality of wires instead of the number of wires in the plurality of wires.

With binary vector signaling, each component takes on a coordinate value (or "coordinate", for short) that is one of two possible values. As an example, eight single ended signaling wires may be considered collectively, with each component/wire taking on one of two values each signal period. A "code word" of this binary vector signaling is one of the possible states of that collective set of components/wires. A "vector signaling code" or "vector signaling vector set" is the collection of valid possible code words for a given vector signaling encoding scheme. A "binary vector signaling code" refers to a mapping and/or set of rules to map information bits to binary vectors.

With non-binary vector signaling, each component has a coordinate value that is a selection from a set of more than two possible values. A "non-binary vector signaling code" refers to a mapping and/or set of rules to map information bits to non-binary vectors.

Examples of vector signaling methods are described in Cronie I, Cronie II, Cronie III, and Cronie IV.

Signaling using a plurality of wires that change state simultaneously may be associated with undesirable secondary effects within the output circuit, due to the physical need to change the output level on multiple wire loads. The resulting anomalous noise, caused by this current draw from power sources and/or current drain into ground lines and/or power returns, is known as Simultaneous Switched Output noise or SSO.

BRIEF SUMMARY

In accordance with at least one embodiment of the invention, processes and apparatuses provide for transmitting data over physical channels to provide a high speed, low latency interface with no or reduced Simultaneous Switching Output noise as compared to single-ended interfaces using the same physical pin count.

One example embodiment of the invention describes a channel interface between a memory controller and one or more memory devices, which must deliver at least the same throughput as a single-ended solution with significantly less SSO and reduced power utilization, without requiring additional pin count or significantly increased transfer latency. Controller-side and memory-side embodiments of such channel interfaces are disclosed. In some embodiments of the invention, different voltage, current, etc. levels are used for signaling and more than two levels may be used, such as a vector signaling code wherein each wire signal may take on any of three, four, or more values.

This Brief Summary is provided to introduce a selection of concepts in a simplified form that are further described below in the Detailed Description. This Brief Summary is not intended to identify key or essential features of the claimed subject matter, nor is it intended to be used as an aid in determining the scope of the claimed subject matter. Other objects and/or advantages of the present invention will be apparent to one of ordinary skill in the art upon review of the Detailed Description and the included drawings.

BRIEF DESCRIPTION OF THE DRAWINGS

Various embodiments in accordance with the present disclosure will be described with reference to the drawings. Same numbers are used throughout the disclosure and figures to reference like components and features.

FIGS. 2A and 2B show circuit examples of a multi-level output driver and a multi-level input receiver, in accordance with at least one embodiment of the invention.

FIGS. 8A and 8B are charts summarizing and comparing the vector signaling code embodiments described herein in accordance with the invention.

DETAILED DESCRIPTION

Figure 1A:
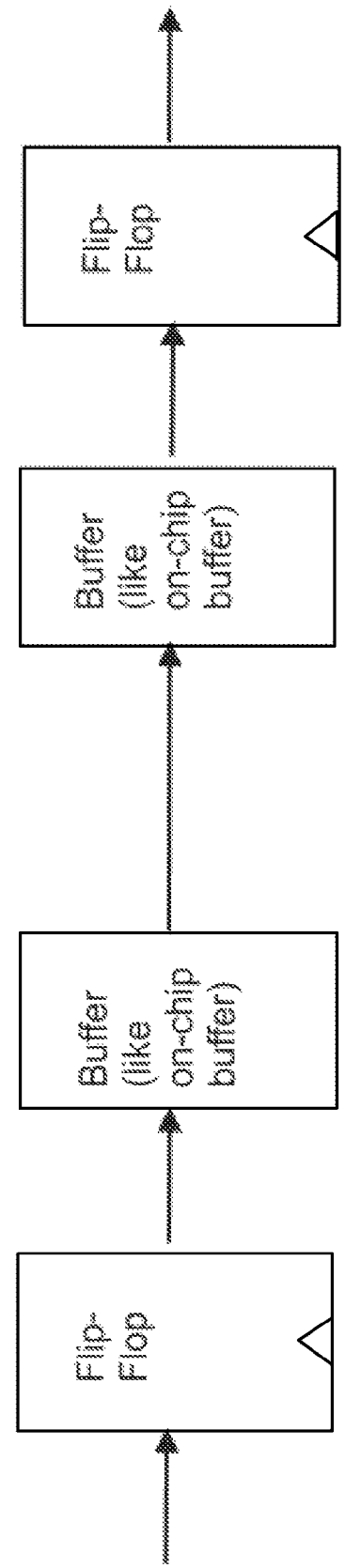
FIGS. 1A and 1B show block diagrams for a conventional single-ended multiwire interface, and a vector signaling coded interface in accordance with at least one embodiment of the invention.

Specialized memory subsystems of modern computer systems utilize dedicated memory controllers to manage access, optimize performance, and improve utilization and reliability. Interconnections between these memory controllers and memory devices must operate at high speeds, delivering reliable and low latency data transfers, while under significant constraints in terms of available pin count and power utilization. To maximize data transfer throughput and efficiency, extremely wide data transfer operations are the norm, typically of 128 bits or more per cycle, as shown in the block diagram of FIG. 1A. These wide I/O transfers put considerable strain on output driver power utilization, especially when many bits change state simultaneously. Such Simultaneous Switched Output transitions may draw significant power supply current and/or introduce considerable return current into the ground line, significantly raising the system noise level.

Methods of addressing Simultaneous Switched Output noise are known, generally operating by reducing the number of wires allowed to change simultaneously by spreading the state change over multiple clock cycles, or by selective inversion of sets of wires as indicated by additional interface signals. However, devices relying on standardized physical interface specifications do not have the liberty of introducing additional interface signals, or of extending data transfer operations over a longer period of time.

Moreover, the design of interfaces to such interconnections is further constrained by implementation requirements, as controller devices are typically implemented using high speed logic processes, while memory devices such as DRAM rely on specialized processes optimized for high storage density and low leakage, but possibly not for fast logic speed. Thus, a successful memory-to-controller interconnection architecture must support implementation in these multiple semiconductor processes.

In accordance with at least one embodiment of the invention, several classes of SSO reducing and SSO eliminating codes are presented, their properties investigated, and example embodiments of encoders and decoders described.

The described solutions all meet the goals:

Implementable in both high-speed logic and DRAM processes

Consume very low power for the encoder, driver, receiver, and decoder

Reduce (or entirely eliminate) SSO when compared to single ended signaling

Applicable to wide I/O interconnections (128 to 1024 wires)

A number of SSO reducing and SSO eliminating codes are described, for which the encoder and decoder have very small footprint. In applications of primary interest to this document the communication channel between the sender and the receiver has very low insertion loss, and therefore hardly experiences noise caused by ISI, insertion loss, reference noise, or thermal noise. On the other hand, SSO causes a large amount of noise because of the relatively large size of the bus. We therefore trade off immunity to common mode and reference noise in some of our examples to further reduce the size and hence the power consumption of the encoding and decoding circuitry needed for our system.

General Assumptions

For purposes of comparison and without limitation, a reference interface design is assumed to use single-ended CMOS drivers to drive extremely short non-terminated bussed or point-to-point interconnections. Inter-symbol interference and transmission line loss are considered to be small or negligible for the example use, and reference noise and thermal noise are considered to be tractable.

Figure 1B:
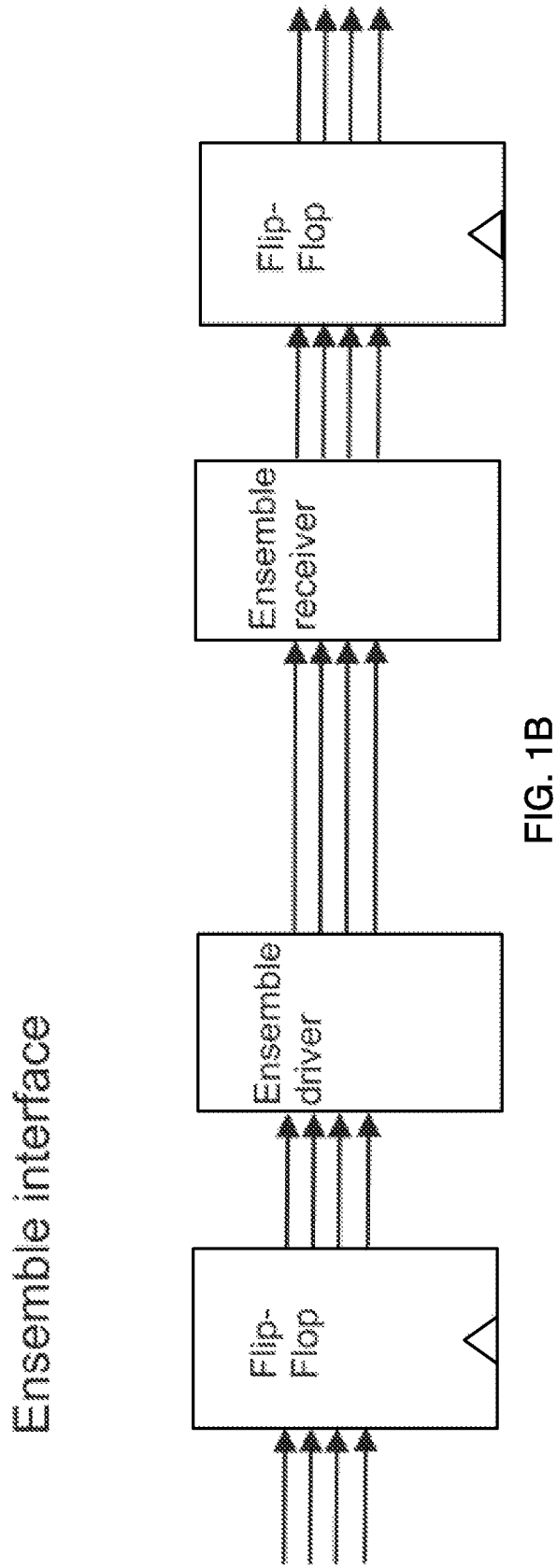

Similarly, for purposes of description and without limitation, examples describing a particular physical interface width will assume data transfer occurs over 128 signal wires or pins, although the described solutions may be equally well applied to both narrower and wider interfaces. The various examples presented herein utilize group or ensemble encoding of subsets of that physical interface, also known as a vector signaling code, as examples in sets of 3 or 4 wires as shown in FIG. 1B. Thus, a physical interface of 128 wires would utilize 43 or 32 instances of the described embodiment, respectively. Embodiments based on group encoding using larger sets of wires are also described, along with the engineering trade-offs associated with selection of set size.

Each described embodiment of the invention offers different degrees of SSO reduction and/or power consumption, and some allow trading off immunity to common mode and reference noise in favor of reduced implementation size and required power consumption.

Figure 2A:
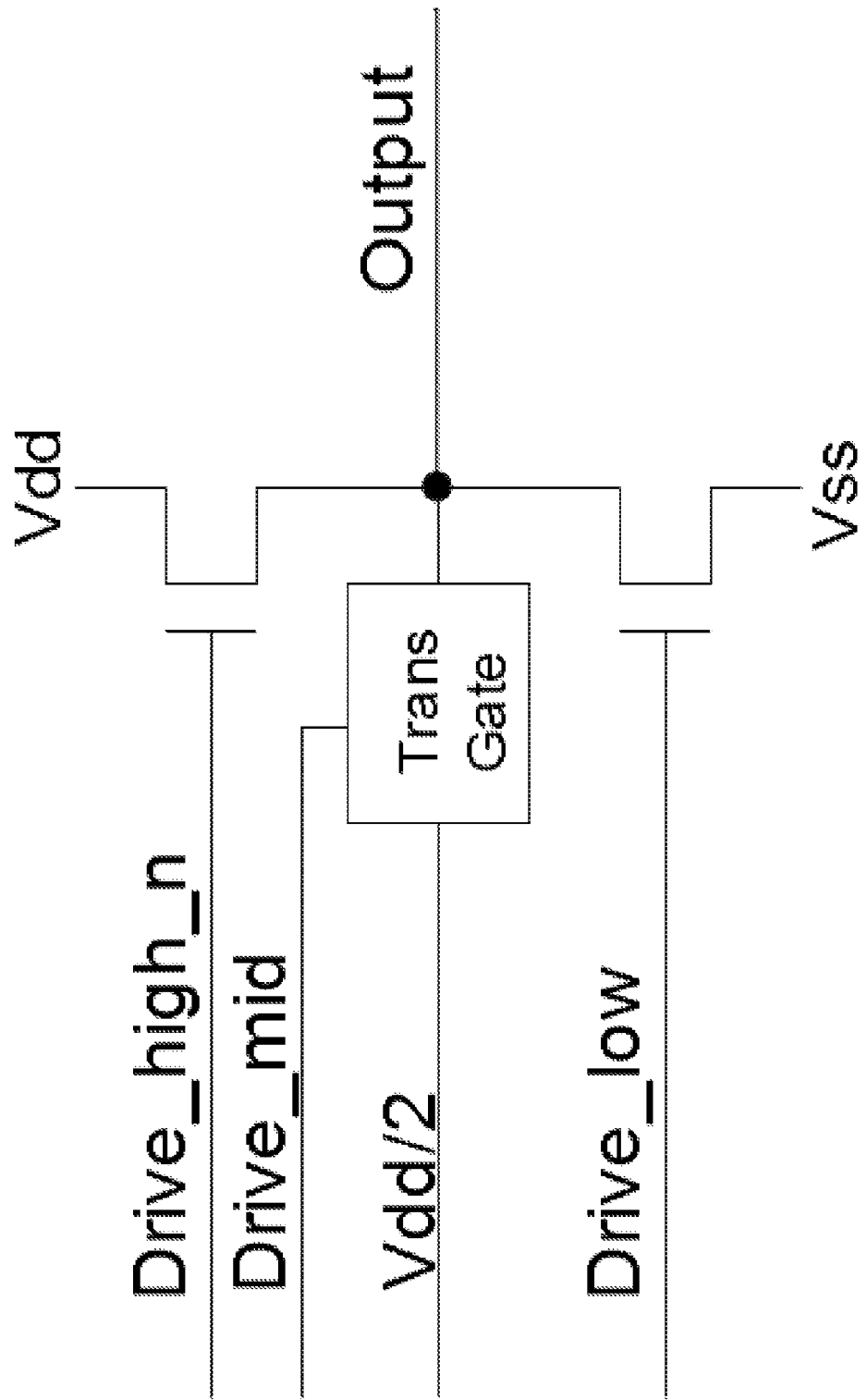

In accordance with at least one embodiment of the invention, signaling using three or more distinct signal levels may be used. As one example, an output driver for a three level or ternary signaling method is shown in the circuit diagram of FIG. 2A, with a complimentary ternary input receiver. Further embodiments using four level or quaternary signaling methods are also described, incorporating additional voltage levels and transmission gates into the example driver, and additional input comparison or detection transistors into the example receiver. Based on these examples, a knowledgeable practitioner may extend the described concepts to more than 3 or 4 signal levels per wire.

Ternary Levels

In accordance with at least one embodiment of the invention, three distinct output levels may be transmitted on every transmission wire, in a "ternary coding" scheme. The coordinate levels of the ternary code correspond to voltage levels on the wires, which in turn depends on the Vdd of the system and the swing of the signals. To permit a voltage-independent description allowing fair comparison to single-ended signaling, the descriptions assume that:

For full-swing Single-Ended (SE) binary signaling, the voltage level multipliers are 0 and 1 (i.e., the voltage levels correspond to 0*Vdd (which is typically equal to Vss) and 1*Vdd)

For Full-Swing (FS) ternary coding, the voltage level multipliers are 0, ½, and 1.

For Reduced-Swing (RS) ternary coding, the voltage level multipliers are 0, ¼, and ½.

For each described coding schemes, we will compare the performance against that of single-ended signaling. Both SSO and power consumption will be described by a single number. For the power consumption, this number has to be compared against ¼, which is the average per wire power consumption of single-ended signaling. For the worst case SSO, our numbers are to be compared against 1, which is the worst case SSO of single-ended signaling.

The multipliers used as examples are taken for purposes of descriptive clarity. Some embodiments of the invention may rely on other multiplier factors of Vdd or equivalent absolute signal levels satisfying the same signal identification purpose. As examples, one embodiment of reduced swing ternary signaling may use coordinates of ¼ Vdd, ½ Vdd, ¾ Vdd, and another embodiment may use coordinates of 0 V, 300 mV, and 600 mV, each representing three distinct coordinate values spanning a range less than that of a full-swing CMOS binary signal.

Similarly, embodiments utilizing quaternary or higher-ordered signaling may define four (or more) levels extending across the entire Vdd to Vss span to create a full-swing signaling scheme, or may define such levels contained within a smaller overall span, creating a reduced-swing signaling scheme.

Line States

For simplicity in the description of coding algorithms later in the document, the two binary states are designated 0 & 1 and the three ternary states as 0, 1, & 2. Similarly, quaternary states are described as 0, 1, 2, & 3. These states are independent of the voltage level multipliers described above that are used to transmit them.

Driver Power Consumption

In the case of a non-terminated CMOS driver, the main power drawn from the Vdd or positive supply rail is consumed in changing the voltage on the primarily capacitive load of the output line when the driver makes a transition from a lower state to a higher state. For a given load, the amount of consumed power is proportional to the magnitude of the transition. Stated differently, when transitioning from a state $(x_1, \ldots, x_k)$ to a following state $(y_1, \ldots, y_k)$ the driver power on k wires is proportional to the sum $\max(x_1-y_1, 0) + \ldots + \max(x_k-y_k, 0)$. This is independent of the particular reference chosen since the reference is canceled by taking differences. The power consumed by single-ended signals on k wires is between 0 and k, and the average power is k/4 since on a single wire a power consumption of 1 occurs only when transitioning from a 0 to a 1.

A similar calculation may be made to assess the power dissipated (or alternatively, the current injected into the Vss or ground rail) in changing the voltage on the primarily capacitive load of the output line when the driver makes a transition from a higher state to a lower state. In some embodiments, this flow of Vss or ground current may be as significant a design factor as the current drawn from the Vdd or supply rail.

Additional Driver Considerations

A conventional embodiment of a binary output driver is based on a CMOS inverter structure, where a totem pole pair of transistors is used to source current from the Vdd or positive supply rail to the output pin, or conversely sink current from the output pin to the Vss or ground rail. Use of dedicated output driver power rails is known, either for purposes of noise isolation, or to allow the I/O to operate at different or distinct voltage levels compared to the main logic and/or memory systems. Cascaded chains of inverters are commonly used, with the transistors at each stage being scaled up in size and current capability from the extremely low node capacitance and current demands of an internal circuit node, to the relatively massive capacitance and proportionately large current demands of the actual output pin and external load.

In accordance with at least one embodiment of the invention, output drivers for ternary or higher-ordered output levels add additional intermediate voltage elements to the binary driver's single source and single sink transistor. Such intermediary-level outputs may be based on CMOS transmission gate structures connecting an intermediate voltage rail to the output pin, or may alternatively use a single transistor in a source follower topology from such an intermediate voltage rail. There may also be advantages in generating not only intermediary-level outputs but also one or both extreme output levels using such techniques, for example to reduce overall output level swing to less than Vdd-Vss.

Intermediate voltage levels may be generated on-chip, or may be provided from an external source to multiple chips. It should be noted that linear regulator designs such as commonly used to regulate on-chip voltages represent current loads on their supply rail equal to the output current delivered. That is, linear regulation of, as an example, Vdd 1.8 volts to 0.8 volts at a load of 10 ma, will draw the same 10 ma from Vdd, dissipating 10 mw in the series pass transistor. Conversely, an external switching regulator which can incorporate discrete inductors and capacitors might draw merely 5.6 ma from a 1.8 volt supply, converting that power to 0.8 volts at 10 ma with 80% efficiency. Thus, the power dissipation advantages of codes incorporating additional output levels and/or smaller output level swings may be in some part mitigated by the inefficiencies of any associated on-chip voltage regulators.

In some embodiments, the number and magnitude of allowable signal levels may be constrained by driver characteristics. As one example, transistors in some DRAM processes are characterized by rather high Vt values, which may result in relatively low gate overdrive with some combinations of desired output signal value and available voltage rail value.

SSO Noise

The main SSO is caused by transitions between states. The SSO noise value may be normalized to a single number in the following sense: for the SSO on k wires, the SSO caused by the transition from a state $(x_1, \ldots, x_k)$ on the wires to a state $(y_1, \ldots, y_k)$ is set to be equal to $|(x_1-y_1) + \ldots + (x_k-y_k)|$ which in turn is equal to the absolute value of the sum of the coordinates of x minus the sum of the coordinates of y. Because a common reference is canceled through taking the difference, the SSO is independent of the reference.

For a single-ended binary system the SSO produced on 1 wire is either 0 or 1. When taking k wires, the worst case SSO is k, and it can be any number between 0 and k. Simple coding can reduce this number considerably, and even completely reducing it to zero in certain cases.

For single-ended binary signaling on k wires, the power consumption of every transition has a binomial distribution on $0, \ldots, k$ where the probability of a single event is 1/4, and its average is k/4. The SSO of this signaling is also binomially distributed and the worst case SSO is k.

Receiver Power Consumption

In many embodiments, the primary source of static power consumption within the receiver is the differential line receiver or signal level comparator stage derived from a linear differential amplifier topology. Thus, embodiments requiring additional comparators, such as to distinguish multiple signal levels per wire, may be associated with higher static receive current usage. In some embodiments, these factors may be mitigated by gating or disabling comparator power when not required, and/or by using a dynamic rather than static design for the comparator stage.

Single-Ended Signaling Code on 4 Wires

Single-ended signaling on 4 wires is the straightforward generalization of normal single-ended signaling to 4 wires, i.e., each wire is independently running single-ended signaling. This corresponds to a code, albeit a very simple code: the elements transmitted on the 4 wires are all the 16 vectors of 4 bits (a,b,c,d):
(0,0,0,0), (0,0,0,1), (0,0,1,0), (0,0,1,1), (0,1,0,0), (0,1,0,1), (0,1,1,0), (0,1,1,1) (1,0,0,0), (1,0,0,1), (1,0,1,0), (1,0,1,1), (1,1,0,0), (1,1,0,1), (1,1,1,0), (1,1,1,1)

Power Consumption and SSO

It is obvious that the average power consumption of this scheme on the 4 wires is 1: this is because the average power consumption as previously defined per wire is 0.25; this follows from the fact that out of the 4 transitions 0 to 0, 0 to 1, 1 to 0, and 1 to 1 only the transition 0 to 1 costs 1 unit of power and the others cost 0 units of power. Since all transitions are equally likely, the average per wire power consumption is 0.25, and hence the average power consumption on 4 wires is 4×0.25=1. The worst case per-wire power consumption is 1, and hence the worst case power consumption for the 4 wires is 4. The worst case SSO for this scheme is 4 for the 4 wires, and hence the worst-case per-wire SSO is 1. The worst case power consumption on an interface with 128 wires is 128 units, the average power consumption is 32 units, and the standard deviation from the average (assuming uniformly random input) is 27.71.

Encoding and Decoding

There is no real encoding and decoding for this code; these operations are performed by the driver and by the receiver directly outputting and directly inputting binary values to the interconnection wires. The receiver samples the wire and measures the value against ½. If the value is below ½, then a decision is made in favor of the value 0, otherwise the decision is made in favor of the value 1.

SNR of Decoder with Respect to Thermal Noise

We assume that the wires are independently perturbed by additive white Gaussian noise of mean 0 and variance $\sigma^2$. We are interested in the probability that there is at least one bit in a group of 4 that is in error. Because of independence of the noise on the wires, this probability is equal to $$1 - \left(1 - \frac{1}{2}\mathrm{erfc}\left(\frac{1}{2\sqrt{2}\,\sigma}\right)\right)^4 \approx 2\mathrm{erfc}\left(\frac{1}{2\sqrt{2}\,\sigma}\right), \quad [\text{Eqn. 1}]$$

$$\text{where } \mathrm{erfc}(x) = 1 - \frac{2}{\sqrt{\pi}}\int_0^x e^{-t^2}\,dt$$

is the complementary error function. We would like to calculate the value of $\sigma$ for which this error probability is equal to 1e−15; if we write this value of $\sigma$ in the form $\sigma = 10^{-s/20}$, then s is the SNR in dB. So we would like to calculate the SNR for which the error probability is equal to 1e−15. A numerical calculation reveals the following value for the SNR of this scheme to be SNR≈24.1 dB.

TL3 Transition-Limiting Coding

Because it is the transitions that are important in an unterminated CMOS driver, it makes sense to encode the information in the transitions. If we use binary states on the wires then it is not possible to reduce SSO and at the same time maintain full pin-efficiency, i.e., the property of transmitting one bit per clock cycle on every wire. Therefore, some described method of reducing the SSO uses ternary signaling and transition-limiting coding.

TL3 is one such code that reduces the peak SSO to just 33% of single ended.

In accordance with at least one embodiment of the invention, a mod-3 addition method may be used to encode binary data into TL3. This operation adds one of the three integers 0/1/2 with another such integer, and outputs the remainder of this addition when divided by the number 3, as shown by the table:

|   | 0 | 1 | 2 |
|---|---|---|---|
| 0 | 0 | 1 | 2 |
| 1 | 1 | 2 | 0 |
| 2 | 2 | 0 | 1 |

TL3 coding operates on an interface size of three wires, i.e., a group of three wires is used on which the state transitions between the clock cycles are minimized One example embodiment of this invention utilizes the combination of a ternary code and a simple FIR filter. This FIR filter keeps one clock of history and encodes the new information as changes with respect to that history. Other embodiments of self-synchronizing state transition determination are known, and are equivalent. An efficient encoder uses only a few operations on the state of each wire.

In the reduced swing version of TL3 (TL3-RS), the peak per-wire SSO is 1/6, which is less than 17% of the peak per-wire SSO of single-ended signaling. For full-swing TL3 (TL3-FS), the peak per-wire SSO is 1/3, which is less than 34% of the peak per-wire SSO of single-ended signaling.

The average line power consumption of TL3-RS encoded signaling is about 20.6% of the average line power consumption of single-ended signaling. The average line power consumption of TL3-FS encoded signaling is about 41.1% of the average line power consumption of single-ended signaling.

In this and other examples, if the total number of wires is not divisible by the interface size, the interface is designed to have the remaining lines operate in pass-through mode with the same delay as in normal operation.

Figure 9A:
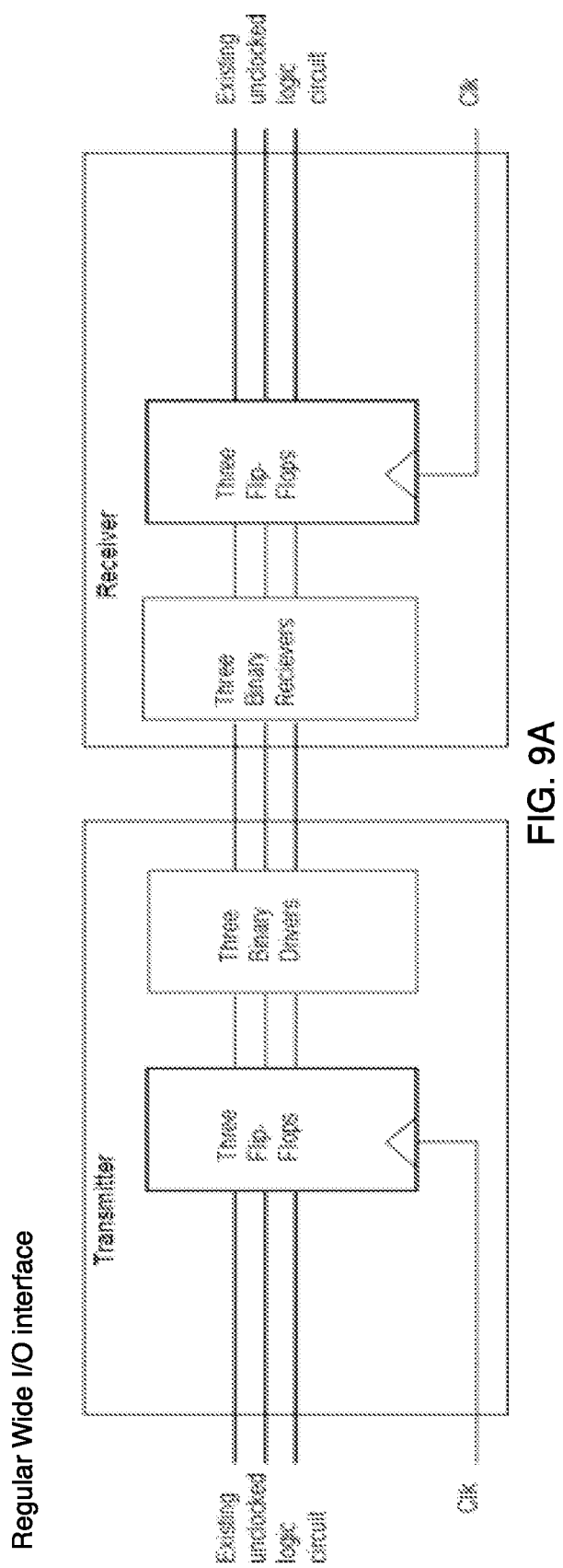
FIGS. 9A and 9B show block diagrams for a conventional single-ended multiwire interface, and a TL3 coded interface in accordance with at least one embodiment of the invention.
Figure 9B:
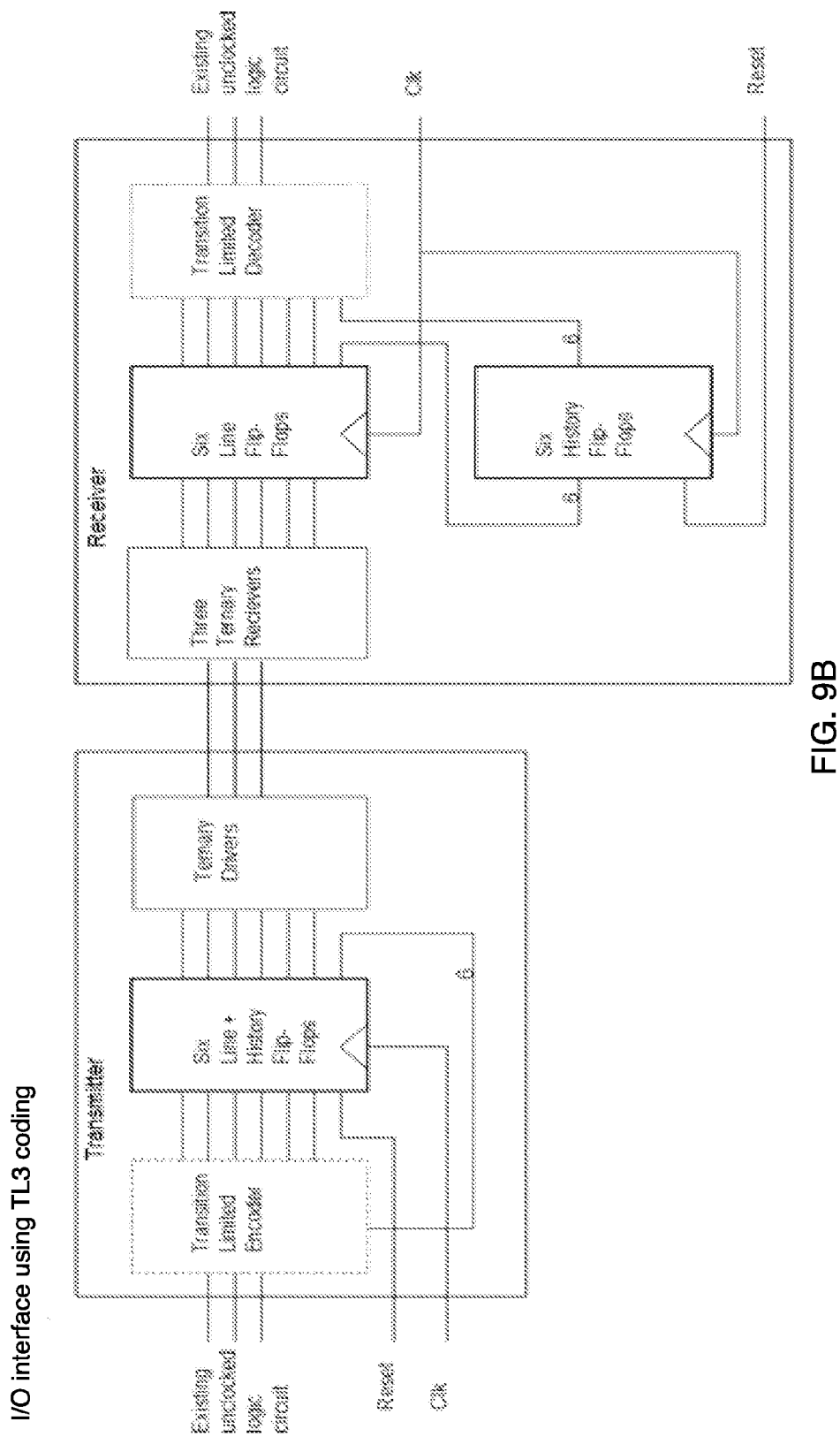

FIGS. 9A and 9B provide block diagrams comparing a three wire subset of a regular wide I/O interface between a transmitting chip and a receiving chip, and a three wire subset of a comparable interface using a TL3 code. As described earlier, the actual signal levels used to represent the three ternary coordinate values is independent of the TL3 coding/decoding, thus FIGS. 9A and 9B illustrate both TL3-FS and TL3-RS variants.

In the TL3 interface illustrated in FIGS. 9A and 9B, the embodiment of the history-storing element within the transmitter is shown as comprising three of the six total flip-flops following the transition-limited encoder. Other embodiments may organize the elements in a different order providing equivalent behavior.

The receiver front end for the ternary codes used by TL3 require two comparators per wire and two reference levels, typically at the midpoints between the 0,1 and 1,2 signal levels. The history-storing element within the receiver is shown as comprising a set of six history flip-flops operating in parallel with the main data flow from ternary receiver to line flip-flops to transition limited decoder. Other embodiments may organize the required elements in a different order providing equivalent behavior, for example, placing the decoder immediately after the ternary receivers.

Reduction of Overall Signal Swing

In accordance with at least one embodiment of the invention, the selected code may be combined with reduced signal swings to provided additional SSO reduction over the reference full-swing binary CMOS example. As one particular example, the described TL3 code may be combined with the previously described RS signal levels, to produce the TL3-RS signaling method. Other such combinations of coding and signal swing constraint are described explicitly below, or otherwise should be considered as implicitly included combinations of the described elements.

Other Variants of the Transition Limiting Code

Other, more efficient variants of the TL3 coding described above exist as well. In one embodiment in accordance with the invention, the interface size is chosen to be 4. A compact code for this case that is similar to the one used for TL3 is called Transition Limiting 4-wire simple or TL4s. Another variant exists with a somewhat larger encoder and decoder called Transition Limiting 4-wire enhanced or TL4e coding. For these two interfaces:

TL4s-RS has a peak SSO of 18.75% of SE.
TL4e-RS has a peak SSO of 12.5% that of SE.

For each of these, the average line power consumption is slightly better than their TL3 full and reduced swing equivalents.

For two other variants, the interface size can be chosen to be equal to either 5 or 8 wires. In these two cases, the simple version of each encoder has performance similar to the enhanced version of the 4 wire interface. Enhanced versions of each of these variants also exist. For the simple versions of these two interface:

TL5s-RS has a peak SSO of 15% of SE.
TL8s-RS has a peak SSO of 12.5% of SE.

In all these listed cases the wires are in one of three states, i.e., the codes are ternary. Using quaternary coding (i.e., coding with 4 levels), more advantages can be gained at the expense of more complicated circuitry for the drivers and more comparators at the receiver. For example, using quaternary coding and a 4-wire interface, the peak SSO is always reduced to 25% of that of single-ended signaling, and the average power consumption is reduced further.

Reset of the Transition Code

Two additional related issues exist with the use of transition codes. The first issue is ensuring that the history values used at each end are coordinated when the bus is used sporadically. The second issue, discussed in the next section, is ensuring that transitions on the line are minimized when the bus is not in use.

The first issue is to ensure that the history values at each end of the bus are using the same value. For buses that are running continuously, this is not an issue because the history values are set after a single clock. For buses such as bidirectional data buses, which are used sporadically by different transmit-receive pairs, and which produce data in narrow intervals, a reset function can also be used to coordinate the value of the history function.

When a data bus is not in use, the history value in the FIR filter at each end is reset to a known value. When that data bus is used, the reset is released at the exact moment that the data becomes valid.

In applications where an address bus is encoded with the TL3 code, two options are possible. The first option is to reset the history value when the address bus is not in use. The second option is to simply allow the address bus to run for a single clock at startup.

Control of the Idle Values

The second issue with the use of transition codes is to carefully control the idle values on the bus. Since one advantage of using a transition code is to minimize the transition on the bus, it may be desirable to ensure that there are no transitions on the bus when the bus is not in use. Many buses sit idle most of the time, so the power dissipated in these situations is central to the overall power consumption of the system.

With transition codes, only a single specific value of the bus leads to no transitions on the bus. This is not an issue with data buses since they are held in reset as described above. Three options exist for address and control buses.

The first option for address and control buses is to organize the interface between the controller and the physical bus, so that during idle periods the address or control bus produces the particular value that is encoded as no transition.

The second option is to hold the address and control in reset when not in use, similar what is done for the address bus.

The third option is to add a bus-holder circuit to the bus interface which has extra flip flops at the transmit end to detect whether the bus has the same value as during the previous clock. The encoder then communicates that information via an additional special code word to the far end. Both the TL3 and TL4 codes could encode such a $9^{th}$ or $17^{th}$ state.

Enhanced TL4 SSO-Reducing Code

In accordance with at least one embodiment of the invention, this variation of the previously described modulus-encoded code called TL4 encodes four bits of data as ternary signals on four wires. This enhanced encoder never uses any of the sixteen code words that have only extreme values such as 2,2,2,0. There are 65 others that don't have that property. The states that have 4 extreme values only have 15 possible destinations, so they can't encode 4 bits. However, the other states all can do it. The ones with 3 extreme values have 17 destinations, and the others are even better.

TL4 Encoding

The task of the encoder is to calculate a codeword upon receiving 4 bits (a,b,c,d). The encoder may either maintain additional state which describes the index of one wire in the previous state that is 1 (a neutral state), say q, and a vector describing the indices of the other positions, say p[0], p[1], p[2] or, alternatively, may compute the additional state on the fly. If the 4 incoming bits correspond to the integer n, then we do the following; h(x) is defined as $h(-1)=h(1)=0$ and $h(0)=1$.—If n=0, then do nothing—If n=1 then change wire with index p[0] by +1—If n=2 then change wire with index p[1] by +1—If n=3 then change wire with index p[2] by +1—If n=4 then change wire with index p[0] by −1—If n=5 then change wire with index p[1] by −1—If n=6 then change wire with index p[2] by −1—If n=7 then change wires with indices p[0] by h(p[0]) and p[1] by h(p[1])—If n=8 then change wires with indices p[0] by h(p[0]) and p[2] by h(p[2])—If n=9 then change wires with indices p[1] by h(p[1]) and p[2] by h(p[2])—If n=10 then change wire with index q by −1 and wire with index p[0] by h(p[0])—If n=11 then change wire with index q by −1 and wire with index p[1] by h(p[1])—If n=12 then change wire with index q by −1 and wire with index p[2] by h(p[2])—If n=13 then change wire with index q by +1 and wire with index p[0] by h(p[0])—If n=14 then change wire with index q by +1 and wire with index p[1] by h(p[1])—If n=15 then change wire with index q by +1 and wire with index p[2] by h(p[2]) In addition to these, the indices q and p[0], p[1], p[2] need to be updated as well. For example, in cases n=0, q does not have to be changed and hence the vector p can remain as it is as well. For the other cases q definitely changes. It is not necessary to have 16 cases around; one can find shortcuts. For example, the cases n=1, 2, 3 are similar and can be handled in a better way.

In further embodiments, the encoding algorithms may use the following two tables:

| $T_1$ | 0 | 1 |
|---|---|---|
| 0 | 1 | 2 |
| 1 | 2 | 0 |
| 2 | 0 | 1 |

| $T_2$ | |
|---|---|
| 0 | 1 |
| 1 | 0 |
| 2 | 1 |

Encoding for TL3: Given three bits (a, b, c), and a prior state (p[0], p[1], p[2]), we would like to calculate uniquely a successor state that replaces the prior state. This is done according to the following algorithm in which the "idle" state corresponds to the bit sequence [1, 1, 1].

| Algorithm 1 Encoding for TL3 |
|---|
| Input: Bits a, b, c, prior state p = (p[0], p[1], p[2]) of the three wires where p[i] ∈ {0,1,2} |
| Output: p changes to its successor state, uniquely determined by a, b, c. |
| 1:         if bc = 0 then |
| 2:                 p[b + 2c] ← T1 (p[b + 2c], a) |
| 3:         else |
| 4:                 if a = 0 then |
| 5:                        p[0] ← T2 (p[0]) |
| 6:                        p[1] ← T2 (p[1]) |
| 7:                 end if |
| 8:         end if |

Therefore, in one embodiment, the encoder receives three input bits (a,b,c). A first logic gate circuit determines if a first two bits (c, b) of the three input bits are not both ones, and if so then a selection circuit utilizes those first two bits to determine which output wire (by determining an index value b+2c) will change states. The encoder receives the prior state of that wire from a state memory circuit (such as by flip-flop storage elements) and in combination with the third input bit, determines the new state (e.g., according to a logic lookup function equivalent to table T1) for the determined wire. In the event that the first two input bits are both ones, the output of the first logic gate circuit in conjunction with the third data bit (a) selectively enables (e.g., when a=0) a lookup circuit that implements the lookup function of table T2 and uses results to determine the new states for the first two wires. For example, the successor state of [0, 2, 1] under [0, 1, 1] is [1, 1, 1] (because cb=1, and a=0, both p[0] and p[1] are modified according to T2, where p[0]=0 changes to 2, and p[1]=2 changes to 1) and the successor state of [0, 2, 1] under [0, 0, 1] is [0, 2, 2] (because cb=0, b+2c=2, and a=0, so p[2]=1 changes to 2 according to T1. One of skill in the art will recognize that Boolean operations may be performed on the above relationships to yield equivalent expressions.

Not all the states are equiprobable in this scheme, even if the bits a, b, c are chosen uniformly and independently at random. The stationary probability distribution on the states is given by the vector:

13/315, 59/1260, 1/35, 59/1260, 1/18, 13/420, 1/35, 13/420, 1/42, 13/315, 59/1260, 1/35, 59/1260, 1/18, 13/420, 1/35, 13/420, 1/42, 13/315, 59/1260, 1/35, 59/1260, 1/18, 13/420, 1/35, 13/420, 1/42.

The $i^{th}$ entry of this vector corresponds to the probability of the state given as the 3-adic expansion of i−1. Hence, 13/315 is the probability of seeing the state[0, 0, 0], 59/1260 is the probability of seeing the state[1, 0, 0], etc.

Average power consumption. We assume that for a, b ∈ {0, 1, 2} a transition a→b requires power proportional to max(b−a, 0)−c min(b−a, 0), wherein c is any constant of our choosing. It turns out that the average power consumption relative to that of single-ended signaling is independent of c. With this assumption, the average power consumption of single-ended signaling is (1+c)/4: transitions 0→0 and 1→1 require no power, transition 0→1 requires one unit, and transition 1→0 requires c units.

In the case of the TL3 code, a calculation shows that the average power consumption per wire is (1+c)×37/360. The average power consumption of the TL3 code divided by the average power consumption of single-ended signaling is therefore 37/90 which is roughly 0.411.

Decoding for TL3. The task of the decoder is to infer from a previous state p=(p[0], p[1], p[2]) and a successor state s=(s[0], s[1], s[2]) the bits a, b, c.

| Algorithm 2 Decoding for TL3 |
|---|
| Input: Prior state p = (p[0], p[1], p[2]) and successor state s = (s[0], s[1], s[2]) on the three wires, where p[i], s[i] ∈ {0, 1, 2} |
| Output: Bits a, b, c |
| 1:         a ← 1, b ← 1, c ← 1 |
| 2:         Calculate w = (s − p) mod 3 |
| 3:         Determine weight of w, and call it m |
| 4:         Determine position $a_0 + 2b_0$ such that w[$a_0 + 2b_0$]≠ 0, t ← w[$a_0 + 2b_0$] |
| 5:         if m = 1 then |
| 6:             b ← $a_0$, c ← $b_0$, a ← t − 1 |
| 7:         else |
| 8:             b ← 1, c ← 1 |
| 9:             if m = 2 then |
| 10:                 a ← 0 |
| 11:             end if |
| 12:       end if |

Encoding for TL4. Given four bits (a, b, c, d), and a prior state (p[0], p[1], p[2], p[3]), we would like to calculate uniquely a successor state which replaces the prior state. This is done according to the following algorithm in which the "idle" state corresponds to the bit sequence [1, 1, 1, 1]. For example, the successor state of [0, 2, 1, 2] under inputs [1, 0, 1, 1] is [0, 2, 0, 1]. Not all the states are equiprobable in this scheme, even if the bits a, b, c, d are chosen uniformly and independently at random.

Average power consumption. A calculation shows that the average power consumption per wire is 1247/10560. The average power consumption of the TL4 code divided by the average power consumption of single-ended signaling is therefore (10/3)×1247/10560)=1247/3168 which is roughly 0.394. This number is independent of how we model the power consumption at transitions. In fact, if we weight downward transitions by a factor of c, and upward transitions by a factor of 1, then the average power consumption of single-ended signaling becomes (1+c)/4, whereas the average power consumption of the TL4 code becomes (1+c)×1247/12672. The ratio remains the same, irrespective of c.

---
Algorithm 3 Encoding for TL4
---

Input: Bits a, b, c, d, prior state p = (p[0], p[1], p[2], p[3]) of the four wires
Output: p changes to its successor state, uniquely determined by a, b, c, d.
1:  if d = 0 then
2:      p[a + 2b] ← T1 (p[a + 2b], c)
3:  else
4:      if bc = 0 then
5:          p[a$\bar{c}$ + 2 ac] ← T2 (p[a$\bar{c}$ + 2 ac])
6:          p[b$\bar{c}$|c + 2$\bar{ac}$] ← T2 (p[b$\bar{c}$|c + 2ac])
7:      else
8:          if a = 0 then
9:              p[0] ← T2 (p[0]), p[1] ← T2 (p[1]), p[2] ← T2 (p[2])
10:         end if
11:     end if
12: end if Thus, in one embodiment, a first logic circuit of the encoder determines if a fourth bit (d) of four bits (a, b, c, d) is a logic 0. If so, then a first selection circuit selects a wire to change states, the index of the selected wire determined by an additional two bits (a, b, in the form of a+2b), and the value of the new state of the selected wire is determined according to table T using the prior state of the selected wire and the data values of the remaining received data bit (c). However, if the fourth bit (d) is a logic 1, then a second logic circuit of the encoder determines if a second pair of two bits (b, c) are both 1, and if not, then two wires are selected for state transitions according to the indices determined by a combination of input bits such as a combination of bits a, c (a$\bar{c}$+2ac), and the combination of a, b, c (b$\bar{c}$|c+2$\bar{ac}$) as set forth above. But if both b and c are also logic 1 (and hence, b=c=d=1), then a third logic circuit also determines whether input bit a is a logic 0, and if so, causes the states of the first second and third wires to be updated according to their prior states and table T2. In the event that all bits are 1, then no wires change state. One of skill in the art will recognize that Boolean operations may be performed on the above relationships to yield equivalent expressions.

Decoding for TL4. The task of the decoder is to infer from a previous state p=(p[0], p[1], p[2], p[3]) and a successor state s=(s[0], s[1], s[2], s[3]) the bits a, b, c, d.

---
Algorithm 4 Decoding for TL4
---

Input: Prior state p=(p[0], p[1], p[2], p[3]) and successor state s = (s[0], s[1], s[2], s[3]) on the four wires, where p[i], s[i] ∈ {0, 1, 2}
Output: Bits a, b, c, d
1:   a ← 1, b ← 1, c ← 1, d ← a
2:   Calculate w = (s − p) mod 3
3:   Determine weight of w, and call it m
4:   Determine position $a_0 + 2b_0$ such that w[$a_0 + 2b_0$]/= 0, t ← w[$a_0 + 2b_0$]
5:   If m > 1, determine position $a_1 + 2b_1$ such that w[$a_1 + 2b_1$]/= 0
6:   a ← 1, b ← 1, c ← 1, d ← 1           Idle state
7:   if m = 1 then
8:       a ← $a_0$, b ← $b_0$, c ← t − 1, d ← 0
9:   end if
10:  if m = 2 then
11:      d ← 1, c ← 1 ⊕ $b_0$ ⊕ $b_1$          ⊕=XOR
12:      b ← ($b_0$ ⊕ $b_1$)($a_0 b_0$ ⊕ $a_1 b_1$), a ← $a_0 b_1$|$a_1 b_0$
13:  end if ---
Algorithm 4 Decoding for TL4
---

14:  if m = 3 then
15:      a ← 0, b ← 1, c ← 1, d ← 1
16:  end if

The P2P SSO-Reducing Code

In accordance with at least one embodiment of the invention, a P2P code is described, which is a ternary codes on 2 wires. The code has 4 codewords that are each 2-dimensional. They are given below:

(1/2, 0), (0, 1/2), (1/2, 1), (1, −1/2)

Power Consumption and SSO

Of the 16 possible transitions from one state to another, 8 consume a power of 0, 4 consume a power of 1/2, and 4 consume a power of 1. This gives an average power consumption of 3/8 on 2 wires, or 3/16≈0.1875 per wire. This is 75% of the average power consumption of single-ended signaling. The worst case SSO caused by this code is 1 on 2 wires, which is a factor of 2 better than the worst case SSO caused by single ended signaling. From the results above, the worst-case power consumption on an interface with 128 wires is 64 units, the average power consumption is 24 units, and the standard deviation from the average (assuming uniformly random input) is 3.32.

P2P Encoding and Decoding

The task of the encoder is to calculate a codeword upon receiving 4 bits (a,b,c,d).

For decoding, we assume that the (possibly equalized) values on the wires are x, y.

Two decoding variations are described. In the first, we collect the results of the following comparisons:

Compare x against y and denote the corresponding bit by e.
Compare (x+y)/2 against 0, and denote the corresponding bit by f.

Figure 3:
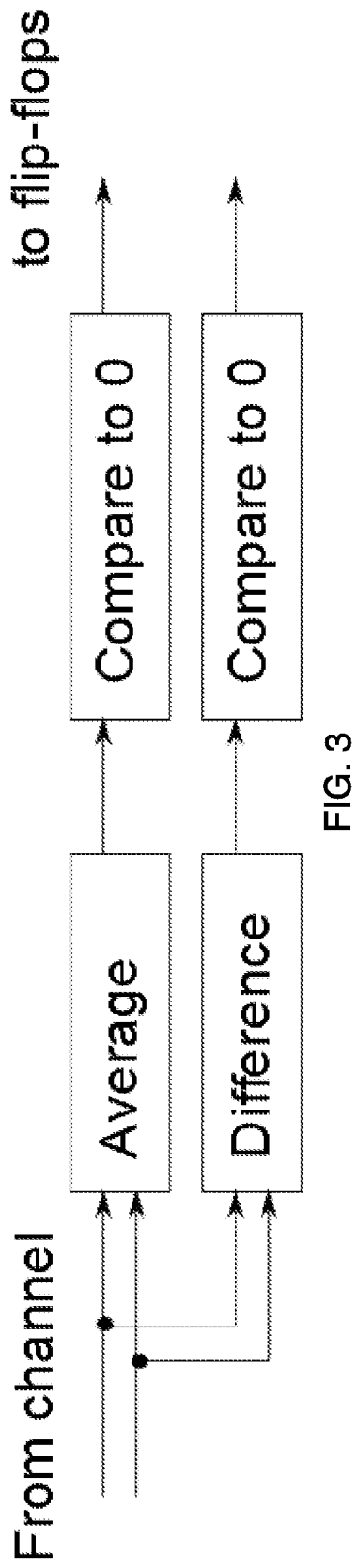
FIG. 3 is a block diagram of an optimized receiver for the P2P code, in accordance with at least one embodiment of the invention.

FIG. 3 is a block diagram of an optimized receiver for the P2P code using this variation, in accordance with at least one embodiment of the invention.

In the second variation, two stacked CMOS single-ended receivers as shown in FIG. 2B are used to produce x_high, x_low, y_high, and y_low.

For either variation, a combinatorial digital logic circuit is used to recover the two original bits from these comparison results.

P4P SSO-Reducing Code

In accordance with at least one embodiment of the invention, the P4P code described, which is a variant of P4 code in which resistance to common mode is sacrificed in order to get an additional bit. The code has 16 codewords that are each 4-dimensional. They are given below:

±(1/2,1/6,1/6,−1/6), ±(1/2,1/6,−1/6,1/6), ±(1/6,−1/6,1/2,1/6), ±(1/6,−1/6,1/6,1/2) ±(1/6,1/2,1/6,−1/6), ±(1/6,1/2,−1/6,1/6), ±(−1/6,1/6,1/2,1/6), ±(−1/6,1/6,1/6,1/2)

Power Consumption and SSO

Of the 256 transitions from one state to another, 64 consume 0 power, 48 consume power 1/3, 80 consume power 2/3, 48 consume power 4/3, and 16 consume power 5/3. This gives an average power consumption of 5/8 across 4 wires, and hence an average power consumption of 5/32 per wire, which is equal to 0.15625. This is 62.5% of the average power used by un-terminated single-ended signaling.

The SSO caused by the transitions is equal to 0 for half of the transitions, and equal to 4/3 for the other half. The worst case SSO is therefore 4/3, which is a factor of 3 better than the SSO caused by single-ended signaling. The average SSO is 2/3, which is also a factor of 3 better than the average SSO of single-ended signaling. From the results above, the worst case power consumption on an interface with 128 wires is 160/3≈53.33 units, the average power consumption is 20 units, and the standard deviation from the average (assuming uniformly random input) is 16.81.

P4P Encoding

The task of the encoder is to calculate a codeword upon receiving 4 bits (a,b,c,d). There are essentially two different ways to accomplish this. One is using a purely digital encoder with the following pseudo-code:

```
If d == 0 then
    Put a 1/2 on wire at position a+2*b
    Put a 1/6 on wires at positions (¬a) + 2*b and (¬c) + 2*(¬b)
    /* ¬x is the NOT of x*/
    Put a −1/6 on wire at position c + 2*(¬b)
Else
    Put a −1/2 on wire at position a+2*b
    Put a −1/6 on wires at positions (¬a) + 2*b and (¬c) + 2*(¬b)
    /* ¬ is the NOT of x*/
    Put a 1/6 on wire at position c + 2*(¬b)
```

For example, if the input bits are (a,b,c,d)=(1,1,1,0), then we will be in the first case since d=0. We put a 1/2 on wire at position 1+2*1=3, a 1/6 on wire at position ¬1+2*1=2 and on wire at position ¬1+2*(¬1)=0, and a −1/6 on wire at position 1+2*(¬1)=1. The codeword is therefore (1/6,−1/6, 1/6,1/2).

The second encoder uses a matrix representation of the code, and computes the following values in analog: given (a,b,c,d), represented in this case as +1 and −1 rather than 0/1, we do the following:

Calculate (a+b+d)/6 and put the value on wire 1
Calculate (a−b+d)/6 and put the value on wire 2
Calculate (a+c−d)/6 and put the value on wire 3
Calculate (a−c−d)/6 and put the value on wire 4

P4P Decoding

The task of the decoder is to receive (possibly equalized) values x, y, z, u on the wires and to produce the bits a, b, c, d that have given rise to these values. The following description assumes the received bits are recovered as +1 and −1 rather than as 0 and 1. To achieve this task, the decoder will use four comparators. One of them compares a linear combination of the values x, y, z, u against a fixed reference 0, and the other three comparators compare linear combinations of some of the values against linear combinations of others.

Compare (x+y+z+u)/4 against 0. This gives the bit a.
Compare x against y. This gives the bit b.
Compare z against u. This gives the bit c.
Compare (x+y)/2 against (z+u)/2. This gives the bit d.

Figure 4:
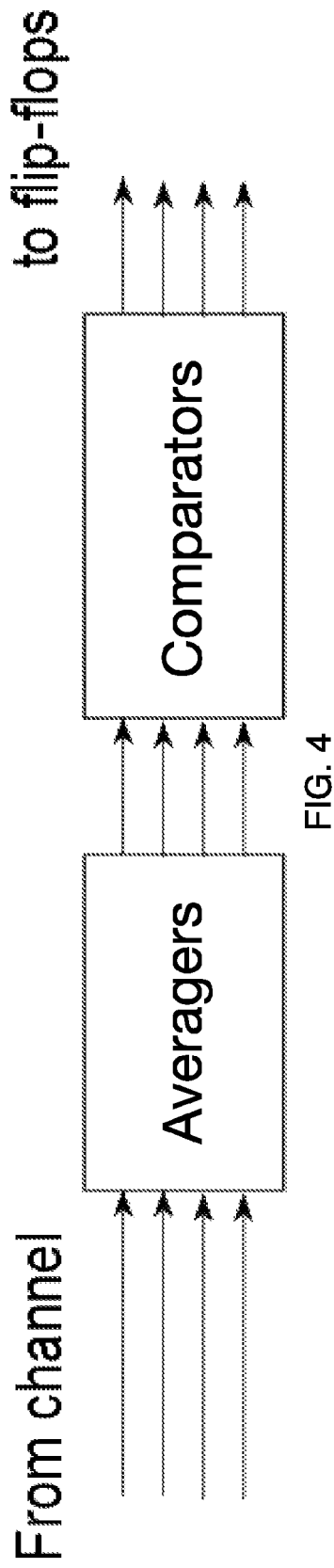
FIG. 4 is a block diagram of an optimized receiver for either the P4P or H4P code, in accordance with at least one embodiment of the invention.

FIG. 4 is a block diagram of an optimized receiver for the P4P code, in accordance with at least one embodiment of the invention.

SNR of Decoder with Respect to Thermal Noise

We assume that the values on the wires are perturbed by independent additive white Gaussian noise terms with mean 0 and variance $\sigma^2$. We will compute the probability of error for each of the comparators above.

The first comparator compares (x+y+z+u)/4 against 0. The average value of this term is 1/6 for half of the codewords and −1/6 for the other half. The value (x+y+z+u)/4 is therefore ±1/6+m, where m is a Gaussian random variable with mean 0 and standard deviation $\sigma/2$. The probability that this term is less than 0 in case the average is 1/6 is $0.5\,\text{erfc}(1/3\sigma\sqrt{2})$. If the average of −1/6 the same probability is obtained.

The second comparator compares x against y, or equivalently, x−y against 0. The average value of this random variable is 1/3 or −1/3, and hence the value of the random variable is ±1/3+m, where m is a Gaussian random variable of mean 0 and standard deviation $\sigma\sqrt{2}$. The error probability of this comparator is $0.5\,\text{erfc}(1/6\sigma)$.

The third comparator has very similar properties as the second one, and its error probability is $0.5\,\text{erfc}(1/6\sigma)$.

The fourth comparator compares (x+y)/2 against (z+u)/2, or equivalently (x+y)/2−(z+u)/2 against 0. The average value of this random variable is ±1/3, so this random variable is ±1/3+m, where m is a Gaussian random variable of mean 0 and standard deviation $\sigma$. The probability that this term is less than 0 in case the average is 1/3 is $0.5\,\text{erfc}(1/3\sigma\sqrt{2})$. If the average of −1/3 the same probability is obtained.

Altogether, the error probability that at least one of the comparators makes an error is at most $$\text{erfc}(1/3\sigma\sqrt{2}) + \text{erfc}(1/6\sigma) \approx \text{erfc}(1/6\sigma). \quad [\text{Eqn. 2}]$$

A numerical approximation reveals that to achieve a block error rate of 1e−15 we need an SNR=30.6 dB. The SNR is hence 6.5 dB worse than that of single-ended signaling.

H4P SSO-Reducing Code

In accordance with at least one embodiment of the invention, the H4P code is described, which is a variant of Kandou's H4-code in which resistance to common mode is sacrificed in order to get an additional bit. The code has 16 codewords that are each 4-dimensional. They are given below:
±(1/2,0,0,0), ±(0,1/2,0,0), ±(0,0,1/2,0), ±(0,0,0,1/2) ±(1/4,1/4,1/4,−1/4), ±(1/4,1/4,−1/4,1/4), ±(1/4,−1/4,1/4,1/4), ±(−1/4,1/4,1/4,1/4)

Power Consumption and SSO

Of the 256 transitions from one state to another, 52 consume 0 power, 24 consume a power of 1/4, 100 consume a power of 1/2, 16 consume a power of 3/4, 36 consume a power of 1, 24 consume a power of 5/4, and 4 consume a power of 3/2. The average power consumption of the 4-wire interface is therefore 13/32, and the average per-wire power consumption is 13/128 which is 0.10156. This is about 40% of the average power consumption of single-ended signaling (which is 0.25), and the worst-case power consumption per wire is 3/8, which is 37.5% of the worst-case power consumption of single-ended signaling. The SSO caused by the transitions is equal to 0 for half of the transitions, and equal to 1 for the other half. The worst case SSO is therefore 1, which is a factor of 4 better than the SSO caused by single-ended signaling on this 4-wire interface. The average SSO is 1/2, which is also a factor of 4 better than the average SSO of single-ended signaling. From the results above, the worst case power consumption on an interface with 128 wires is 48 units, the average power consumption is 17.5 units, and the standard deviation from the average (assuming uniformly random input) is 12.87.

H4P Encoding

The task of the encoder is to calculate a codeword upon receiving 4 bits (a,b,c,d). There are essentially two different ways to accomplish this. One is by using a purely digital encoder with the following pseudo-code:

```
If ( d == 0 ) then
    If ( c == 0 ) then
        Put 1/2 at position a+2b, and 0's elsewhere
```

```
        Else
            Put −1/2 at position a+2b, and 0's elsewhere
    Else
        If ( c == 0 ) then
            Put 1/4 at position a+2b and −1/4's elsewhere
        Else
            Put −1/4 at position a+2b and 1/4's elsewhere
```

The second encoder uses a matrix representation of the code, and computes the following values in analog: given (a,b,c,d), this time as +1 and −1 (not 0/1), we do the following:
  Calculate (a+b+c+d)/8 and put the value on wire 1
  Calculate (a+c)/8−(b+d)/8 and put the value on wire 2
  Calculate (a+b)/8−(c+d)/8 and put the value on wire 3
  Calculate (a+d)/8−(b+c)/8 and put the value on wire 4

H4P Decoding

The task of the decoder is to receive (possibly equalized) values x, y, z, u on the wires and to produce the bits a, b, c, d that have given rise to these values. We assume that these bits are recovered as +1 and −1 rather than as 0 and 1. To achieve this task, the decoder will use four comparators. One of them compares a linear combination of the values x, y, z, u against a fixed reference 0, and the other three comparators compare linear combinations of some of the values against linear combinations of others.
  Compare (x+y+z+u)/4 against 0. This gives the bit a.
  Compare (x+z)/2 against (y+u)/2. This gives the bit b.
  Compare (x+y)/2 against (z+u)/2. This gives the bit c.
  Compare (x+u)/2 against (y+z)/2. This gives the bit d.

FIG. 4 is a block diagram of an optimized receiver for the H4P code, in accordance with at least one embodiment of the invention.

SNR with Respect to Thermal Noise

We assume that the values on the wires are perturbed by independent additive white Gaussian noise terms with mean 0 and variance $\sigma^2$. We will compute the probability of error for each of the comparators above.

The first comparator compares (x+y+z+u)/4 against 0. The average value of this term is 1/8 for half of the codewords and −1/8 for the other half. The value (x+y+z+u)/4 is therefore ±1/8+m, where m is a Gaussian random variable with mean 0 and standard deviation $\sigma/2$. The probability that this term is less than 0 in case the average is 1/8 is $0.5 \text{erfc}(1/4\sigma\sqrt{2})$. If the average of −1/8 the same probability is obtained.

All the other comparators have the same error probability. For example, the third comparator compares (x+y)/2 against (z+u)/2, or equivalently (x+y)/2−(z+u)/2 against 0. The average value of this random variable is ±1/4, so this random variable is ±1/4+m, where m is a Gaussian random variable of mean 0 and standard deviation $\sigma$. The probability that this term is less than 0 in case the average is 1/4 is $0.5 \text{erfc}(1/4\sigma\sqrt{2})$. If the average of −1/4 the same probability is obtained.

Altogether, the error probability that at least one of the comparators makes an error is at most $$2\text{erfc}(1/4\sigma\sqrt{2}).$$ [Eqn. 3]

A numerical approximation reveals that to achieve a block error rate of 1e−15 we need at least SNR=30.2 dB. The SNR is hence 6.1 dB worse than that of single-ended signaling.

4b4wT SSO-Eliminating Code

In accordance with at least one embodiment of the invention, the 4b4w code described, which is a union of two Kandou's codes. The code provides complete resistance to SSO noise. The code has 16 codewords that are each 4-dimensional. They are given below:
±(1/2,−1/2,0,0), ±(1/2,0,−1/2,0), ±(1/2,0,0,−1/2), ±(0,1/2,−1/2,0), ±(0,1/2,0,−1/2), ±(0,0,1/2,−1/2), ±(1/2,−1/2,1/2,−1/2), ±(1/2,−1/2,−1/2,1/2)

Power Consumption and SSO

Of the 256 possible transitions from one state to another, 28 consume a power of 0, 84 consume a power of 1/2, and 144 consume a power of 1. This gives an average power consumption of 186/256=93/128 on 4 wires, or 93/512=0.181640625 per wire. This is about 73% of the average power consumption of single-ended signaling. The SSO caused by this code is 0. From the results above, the worst case power consumption on an interface with 128 wires is 32 units, the average power consumption is 23.25 units, and the standard deviation from the average (assuming uniformly random input) is 10.93.

4B4wT Encoding

The task of the encoder is to calculate a codeword upon receiving 4 bits (a,b,c,d). Here is a pseudo-code:

```
If (c & d) == 0 /* "&" is the logical AND */
    Put a 1 on wire at position a+2*b
    Put a −1 on wire at position (a⊕¬c) + 2*(b⊕¬d)
    /* "⊕" denotes XOR , and ¬c is the NOT of c*/
    Put a 0 on the other two wires
Else
    Put a 1 on wires at positions a and b+2
    Put a −1 on wires at positions ¬a and (¬b)+2
```

For example, if the input bits are (a,b,c,d)=(1,0,1,0), then we will be in the first case since the logical AND of 1 and 0 is 0. We put a 1 on wire at position 1+0*2=1, a −1 on wire at position (1⊕0)+2*(0⊕1)=3, and zeros on the other wires. The resulting codeword is thus (0,1,0,−1).

4b4wT Decoding: First Version

Decoding is done via several multi-input comparators. This can be done in several ways. One of these ways is described below.

We assume that the (possibly equalized) values on the wires are x, y, z, u. In a first step, we collect the results of the following 5 comparisons:
  Compare (x+2z)/3 against u and denote the corresponding bit by e.
  Compare (x+2b)/3 against u and denote the corresponding bit by f.
  Compare (2x+u)/3 against y and denote the corresponding bit by g.
  Compare (2x+y)/3 against z and denote the corresponding bit by h.
  Compare (2u+z)/3 against x and denote the corresponding bit by i.

A combinatorial digital logic circuit is used to recover the four original bits from these 5 bits.

Figure 5A:
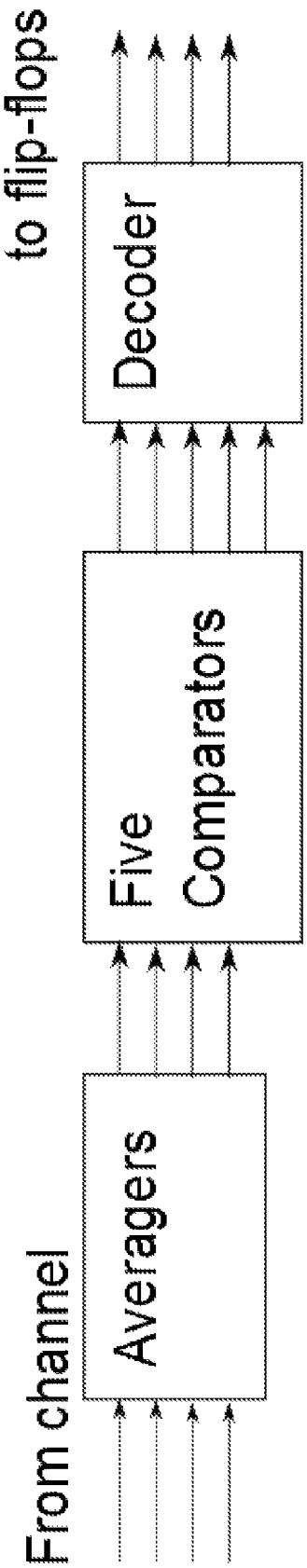
FIGS. 5A and 5B are block diagrams of an optimized receiver for the 4b4wT code, in accordance with at least one embodiment of the invention.

FIG. 5A is a block diagram of this receiver, in accordance with at least one embodiment of the invention.

4B4wT Decoding: Second Version

Again, we assume that the (possibly equalized) values on the wires are x, y, z, u. In a first step, we collect the results of the following 8 comparisons:
  Compare (x+5u)/6 against (y+z)/2 and denote the corresponding bit by e.
  Compare (x+y)/2 against (5z+u)/6 and denote the corresponding bit by f.
  Compare (x+u)/2 against (5z+y)/6 and denote the corresponding bit by g.

Compare $(x+z)/2$ against $(5u+y)/6$ and denote the corresponding bit by h.

Compare $(x+u)/2$ against $(5y+z)/6$ and denote the corresponding bit by i.

Compare $(x+z)/2$ against $(5y+u)/6$ and denote the corresponding bit by j.

Compare $(x+y)/2$ against $(5u+z)/6$ and denote the corresponding bit by k.

Compare $(z+u)/2$ against $(5y+x)/6$ and denote the corresponding bit by l.

Figure 5B:
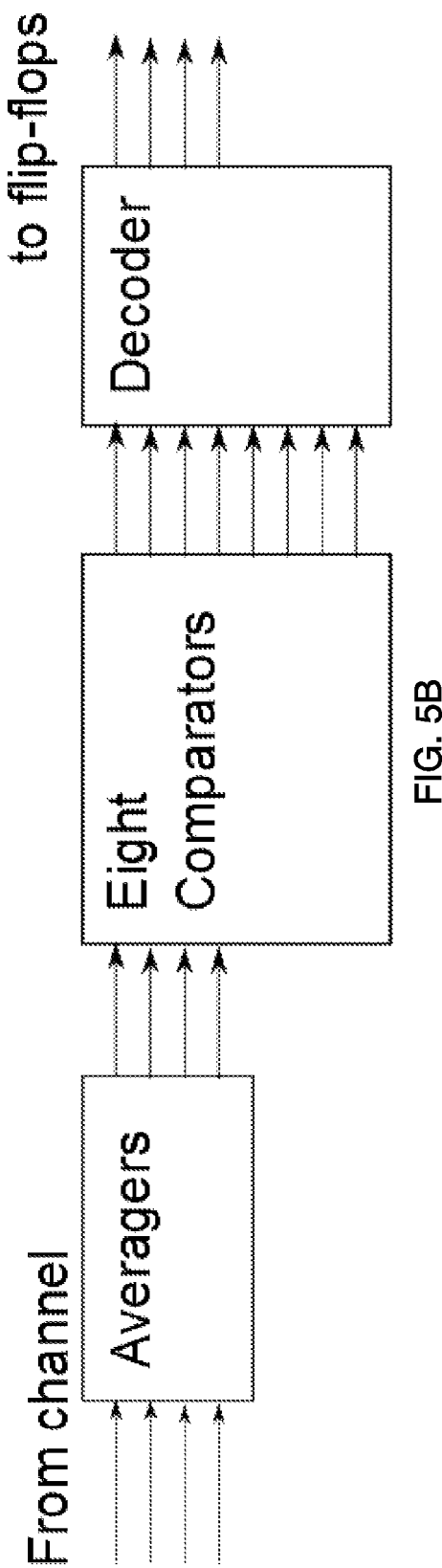

A combinatorial digital logic circuit is used to recover the four original bits from these 8 bits. FIG. 5B is a block diagram of this receiver, in accordance with at least one embodiment of the invention.

SNR with Respect to Thermal Noise

We follow the same analysis as the one for the previous cases. For the first version of the decoder, the smallest average values (in absolute value) that the comparators can have are $\pm 1/6$. Therefore, the actual values are equal to $\pm 1/6 + m$, where m is a Gaussian random variable of mean 0 and standard deviation $\sigma\sqrt{14}/3$. Therefore, the probability that any of the comparators calculates the wrong value is $0.5\,\mathrm{erfc}(1/\sigma\sqrt{28})$, and the probability that at least one of the comparisons produces the wrong value is at most $2.5\,\mathrm{erfc}(1/\sigma\sqrt{28})$. A numerical calculation shows that the SNR in this case is SNR=29.7 dB. The SNR is therefore 5.7 dB worse than that of single-ended signaling.

For the second version of the decoder the smallest average values (in absolute value) that the comparators can have are $\pm 1/3$. Therefore, the actual values are equal to $\pm 1/3 + m$, where m is a Gaussian random variable of mean 0 and standard deviation $\sigma\sqrt{11}/3$. Therefore, the probability that any of the comparators calculates the wrong value is $0.5\,\mathrm{erfc}(1/\sigma\sqrt{22})$, and the probability that at least one of the comparators calculates the wrong value is at most $2.5\,\mathrm{erfc}(1/\sigma\sqrt{22})$. A numerical calculation shows that the SNR in this case is SNR=28.6 dB.

The SNR is therefore 4.6 dB worse than that of single-ended signaling.

4B4wQ SSO-Eliminating Code

In accordance with at least one embodiment of the invention, the 4b4w code is described, which is one of Kandou's quaternary codes. The code provides complete resistance to SSO noise. The code has 16 codewords that are each 4-dimensional. They are given below:
(−1/2, −1/6, 1/6, 1/2), (−1/6, −1/2, 1/6, 1/2), (−1/2, −1/6, 1/2, 1/6), (−1/6, −1/2, 1/2, 1/6) (1/6, −1/6, −1/2, 1/2), (1/6, −1/2, −1/6, 1/2), (1/2, −1/6, −1/2, 1/6), (1/2, −1/2, −1/6, 1/6) (−1/2, 1/2, 1/6, −1/6), (−1/6, 1/2, 1/6, −1/2), (−1/2, 1/6, 1/2, −1/6), (−1/6, 1/6, 1/2, −1/2) (1/6, 1/2, −1/2, −1/6) (1/6, 1/2, −1/2, −1/6), (1/6, 1/2, −1/6, −1/2), (1/2, 1/6, −1/2, −1/6), (1/2, 1/6, −1/6, −1/2)

Power Consumption and SSO

Of the 256 possible transitions from one state to another 16 consume a power of 0, 40 consume a power of 1/3, 64 consume a power of 2/3, 72 consume a power of 1, and 64 consume a power of 4/3. This gives an average power consumption of 5/6 on 4 wires, or $5/24 \approx 0.20833$ per wire. This is about 83.33% of the average power consumption of single-ended signaling. The SSO caused by this code is 0. From the results above, the worst-case power consumption on an interface with 128 wires is $128/3 \approx 42.67$ units, the average power consumption is 20 units, and the standard deviation from the average (assuming uniformly random input) is 12.79.

4B4wQ Encoding

The task of the encoder is to calculate a codeword upon receiving 4 bits (a,b,c,d). Here is a pseudo-code:

Put −1/2 on wire at position a + 2( ( ¬ a & c) | (d & a) ) // ¬ x is the NOT of x
Put −1/6 on wire at position ¬ a + 2( (c & a) | (d & ¬ a) ) // "&" is the logical AND
Put 1/6 on wire at position b + 2( ( ¬ c & ¬ b) | (b & ¬ d) ) // "|" is the logical OR
Put 1/2 on wire at position ¬ b + 2( ( ¬ c & b) | ( ¬ b & d) )

4B4wQ Decoding

We assume that the (possibly equalized) values on the wires are x, y, z, u. In a first step, we collect the results of the following 6 comparisons:

Compare x against y and denote the corresponding bit by e.
Compare x against z and denote the corresponding bit by f.
Compare x against u and denote the corresponding bit by g.
Compare y against z and denote the corresponding bit by h.
Compare y against u and denote the corresponding bit by i.
Compare z against u and denote the corresponding bit by j.

Figure 6:
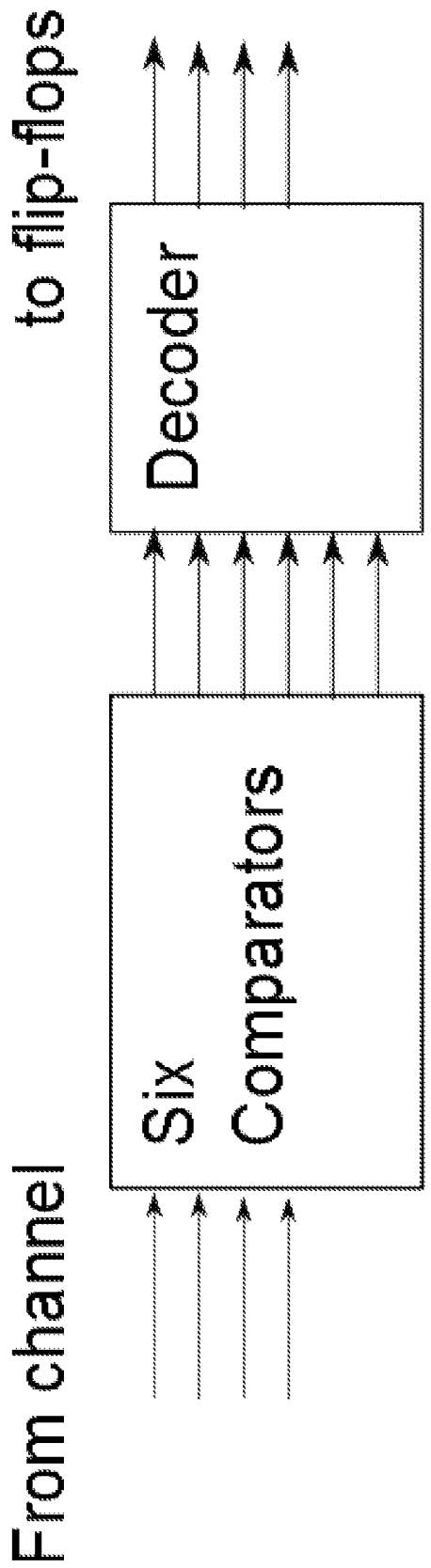
FIG. 6 is a block diagram of an optimized receiver for the 4b4wQ code, in accordance with at least one embodiment of the invention.

A combinatorial digital logic circuit is used to recover the four original bits from these 6 bits. FIG. 6 is a block diagram of an optimized receiver for the 4b4wQ code, in accordance with at least one embodiment of the invention.

SNR with Respect to Thermal Noise

In this case the SNR is exactly that of a reference-less PAM-4 receiver, which means that the required SNR to achieve 1e−15 error probability is about 30.5 dB.

2b2wT SSO-Reducing Code

In accordance with at least one embodiment of the invention, a 2b2wT code is described, which is one of Kandou's ternary codes on 2 wires. The code has 4 codewords that are each 2-dimensional. They are given below:
(1/2,0), (−1/2,0), (0,1/2), (0,−12)

Power Consumption and SSO

Of the 16 possible transitions from one state to another, 8 consume a power of 0, 4 consume a power of 1/2, and 4 consume a power of 1. This gives an average power consumption of 3/8 on 2 wires, or $3/16 \approx 0.1875$ per wire. This is 75% of the average power consumption of single-ended signaling. The worst case SSO caused by this code is 1 on 2 wires, which is a factor of 2 better than the worst case SSO caused by single ended signaling. From the results above, the worst-case power consumption on an interface with 128 wires is 64 units, the average power consumption is 24 units, and the standard deviation from the average (assuming uniformly random input) is 3.32.

2B2wT Encoding

The task of the encoder is to calculate a codeword upon receiving 4 bits (a,b,c,d). Here is a pseudo-code:

Put −1/2 on wire at position a + 2( ( ¬ a & c) | (d & a) ) // ¬ x is the NOT of x
Put −1/6 on wire at position ¬ a + 2( (c & a) | (d & ¬ a) ) // "&" is the logical AND
Put 1/6 on wire at position b + 2( ( ¬ c & ¬ b) | (b & ¬ d) ) // "|" is the logical OR
Put 1/2 on wire at position ¬ b + 2( ( ¬ c & b) | ( ¬ b & d) )

2B2wT Decoding

We assume that the (possibly equalized) values on the wires are x, y, z, u. In a first step, we collect the results of the following 6 comparisons:

Compare x against y and denote the corresponding bit by e.
Compare x against z and denote the corresponding bit by f.
Compare x against u and denote the corresponding bit by g.
Compare y against z and denote the corresponding bit by h.

Compare y against u and denote the corresponding bit by i.
Compare z against u and denote the corresponding bit by j.

Figure 7:
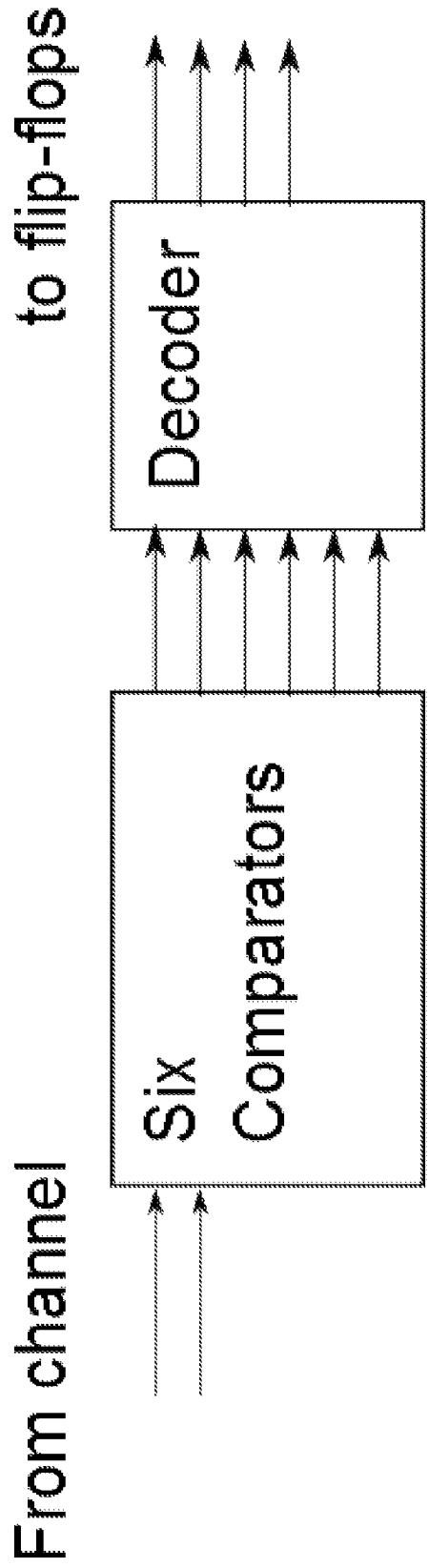
FIG. 7 is a block diagram of an optimized receiver for the 2b2wT code, in accordance with at least one embodiment of the invention.

A combinatorial digital logic circuit is used to recover the four original bits from these 6 bits. FIG. 7 is a block diagram of an optimized receiver for the 2b2wT code, in accordance with at least one embodiment of the invention.

SNR with Respect to Thermal Noise

In this case the SNR is exactly that of a reference-less PAM-4 receiver, which means that the required SNR to achieve 1e−15 error probability is about 30.5 dB.

Summary and Comparison of Codes

FIGS. 8A and 8B are charts summarizing and comparing the vector signaling code embodiments described herein in accordance with the invention.

The examples presented herein illustrate the use of vector signaling codes for point-to-point or bussed chip-to-chip interconnection. However, this should not been seen in any way as limiting the scope of the described invention. The methods disclosed in this application are equally applicable to other interconnection topologies and other communication media including optical, capacitive, inductive, and wireless communications. Thus, descriptive terms such as "voltage" or "signal level" should be considered to include equivalents in other measurement systems, such as "optical intensity", "RF modulation", etc. As used herein, the term "physical signal" includes any suitable behavior and/or attribute of a physical phenomenon capable of conveying information. Physical signals may be tangible and non-transitory.

We claim:

1. A method comprising:
   receiving a set of input bits representing information;
   mapping, using an encoder, values to a set of wires, the values corresponding to elements of a transmit codeword of a vector signaling code, wherein at least one value is mapped by assigning the value to a corresponding wire having a wire position index determined by a logical combination of at least two of the input bits; and,
   transmitting, using a plurality of line drivers, the values on the set of wires.

2. The method of claim 1, wherein the at least one value is selected from a set of values based on a subset of the input bits.

3. The method of claim 1, wherein the vector signaling code is a H4P code.

4. The method of claim 1, wherein the vector signaling code is a 4b4wT code.

5. The method of claim 1, wherein the vector signaling code is a 4b4wQ code.

6. The method of claim 1, wherein the vector signaling code is a 2b2wT code.

7. The method of claim 1, wherein the vector signaling code is a P4P code.

8. The method of claim 1, wherein the vector signaling code is a P2P code.

9. The method of claim 1, further comprising:
   receiving the values on the set of wires;
   forming, using a plurality of averagers, a plurality of averages based on the received values; and,
   forming, using a plurality of comparators, a plurality of comparator output bits based on comparisons of the plurality of averages.

10. The method of claim 9, wherein the comparators are multi-input comparators.

11. The method of claim 9, wherein the comparators are simple two-input comparators.

12. The method of claim 9, wherein the plurality of comparator output bits represents the set of input bits.

13. The method of claim 9, further comprising forming a set of output bits based on the plurality of comparator output bits, the set of output bits representing the set of input bits.

14. An apparatus comprising:
   an encoder configured to receive a set of input bits and to responsively map values to a set of wires, the values corresponding to elements of a transmit codeword of a vector signaling code, wherein at least one value is mapped by assigning the value to a corresponding wire having a wire position index determined by a logical combination of at least two of the input bits; and,
   a plurality of line drivers to transmit the values on the set of wires.

15. The apparatus of claim 14, wherein the value is selected from a set of values, the selection determined by a subset of the set of input bits.

16. The apparatus of claim 15, wherein the vector signaling code is selected from the group consisting of a H4P code, a 4b4wT code, a 4b4wQ code, a 2b2wT code, a P4P code, and a P2P code.

17. The apparatus of claim 14, wherein the encoder comprises combinatorial logic components configured to determine the logical combination.

18. The apparatus of claim 14, further comprising:
   a plurality of averagers configured to receive the values and to generate a plurality of averages based on the received elements; and,
   a plurality of comparators configured to generate a plurality of comparator output bits based on comparisons of the plurality of averages.

19. The apparatus of claim 18, further comprising a combinatorial logic decoder configured to generate a set of output bits based on the plurality of comparator output bits, the set of output bits representing the set of input bits.

20. The apparatus of claim 18, wherein the comparator output bits represent the set of input bits.

* * * * *